(12) United States Patent
Kang et al.

(10) Patent No.: US 9,696,402 B2
(45) Date of Patent: Jul. 4, 2017

(54) PROBE CARD INSPECTION APPARATUS

(71) Applicant: Samsung Electronics Co., Ltd., Suwon-si (KR)

(72) Inventors: Shin-ho Kang, Suwon-si (KR); Joon-su Ji, Hwaseong-si (KR); Jung-woo Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 402 days.

(21) Appl. No.: 14/555,538

(22) Filed: Nov. 26, 2014

(65) Prior Publication Data

US 2015/0168528 A1  Jun. 18, 2015

(30) Foreign Application Priority Data

Dec. 17, 2013 (KR) .................. 10-2013-0157528

(51) Int. Cl.
*G01R 31/02* (2006.01)
*G01R 35/00* (2006.01)
*G01R 31/28* (2006.01)

(52) U.S. Cl.
CPC ......... *G01R 35/00* (2013.01); *G01R 31/2889* (2013.01)

(58) Field of Classification Search
CPC ........ G01R 31/2831; G01R 31/318511; G01R 31/2863; G01R 1/07314; G01R 31/2884; G01R 31/318505; G01R 1/0408; G01R 1/067
See application file for complete search history.

(56) References Cited

U.S. PATENT DOCUMENTS

| | | | |
|---|---|---|---|
| 6,871,307 B2 | 3/2005 | Nachumovsky | |
| 7,157,923 B2* | 1/2007 | Schneider | G01R 31/2831 |
| | | | 324/754.08 |
| 7,479,793 B2* | 1/2009 | Park | G01R 31/2886 |
| | | | 324/756.03 |
| 7,622,940 B2 | 11/2009 | Kim et al. | |
| 7,782,688 B2 | 8/2010 | Kim et al. | |
| 8,283,940 B2 | 10/2012 | Arakawa | |
| 2007/0170939 A1* | 7/2007 | Park | G01R 31/2886 |
| | | | 324/750.01 |

(Continued)

FOREIGN PATENT DOCUMENTS

| | | |
|---|---|---|
| JP | 2010-122108 | 6/2010 |
| JP | 2010-141247 | 6/2010 |

(Continued)

*Primary Examiner* — Alesa Allgood
(74) *Attorney, Agent, or Firm* — Muir Patent Law, PLLC

(57) ABSTRACT

Provided is a probe card inspection apparatus including: a substrate; a first insulating layer which covers the substrate; and a first detection unit which is formed on the first insulating layer and detects physical defects of a probe of a probe card. The first detection unit includes: a ground detection unit including a first conductive pattern which defines a plurality of openings which expose a portion of the first insulating layer and detect defects of a ground probe of the probe card and; and a signal and power detection unit including a second conductive pattern which defines a plurality of openings which expose another portion of the first insulating layer and detect defects of a signal and power supply probe of the probe card.

19 Claims, 25 Drawing Sheets

(56) References Cited

U.S. PATENT DOCUMENTS

| | | |
|---|---|---|
| 2008/0017856 A1 | 1/2008 | Fujino |
| 2008/0054918 A1* | 3/2008 | Lin .................. G01R 1/06772 324/756.03 |
| 2010/0123472 A1 | 5/2010 | Saijou |
| 2010/0213960 A1* | 8/2010 | Mok ...................... G01R 35/00 324/762.03 |
| 2011/0279139 A1* | 11/2011 | Lou .................. G01R 1/07342 324/756.03 |
| 2012/0326743 A1 | 12/2012 | Chang et al. |
| 2013/0147063 A1 | 6/2013 | Park et al. |

FOREIGN PATENT DOCUMENTS

| | | |
|---|---|---|
| JP | 2012-063198 | 3/2012 |
| KR | 10-2003-0065978 | 8/2003 |
| KR | 10-2005-0065844 | 6/2005 |
| KR | 10-2006-0094203 | 8/2006 |
| KR | 10-0805833 | 2/2008 |
| KR | 10-0899664 | 5/2009 |
| KR | 10-2010-0011117 | 2/2010 |
| KR | 10-2013-0000213 | 1/2013 |
| KR | 10-1274208 | 6/2013 |

* cited by examiner

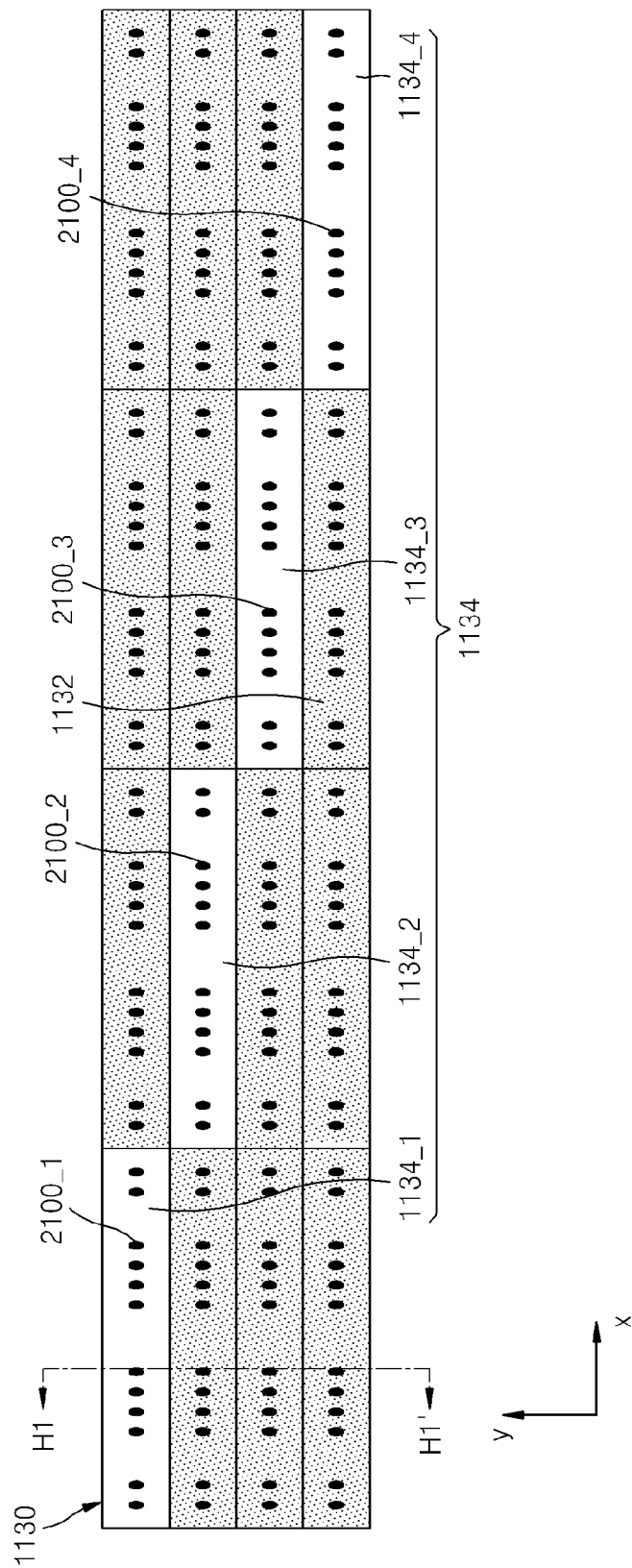

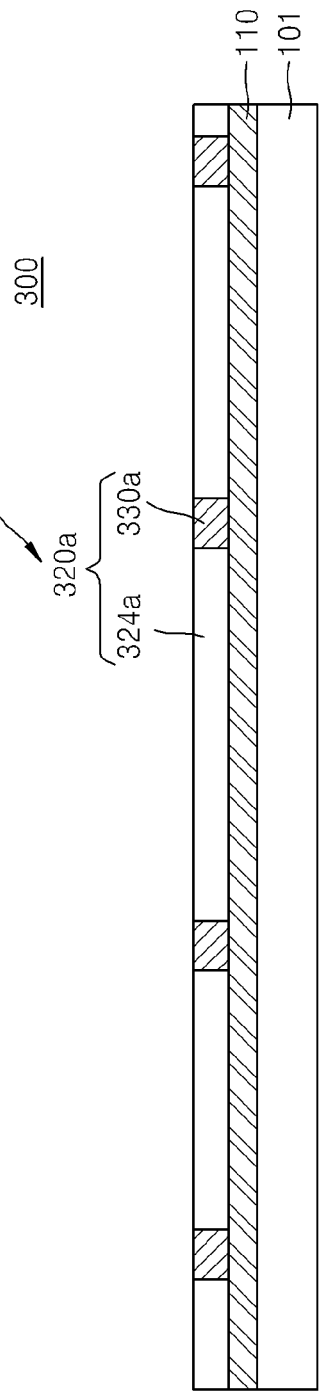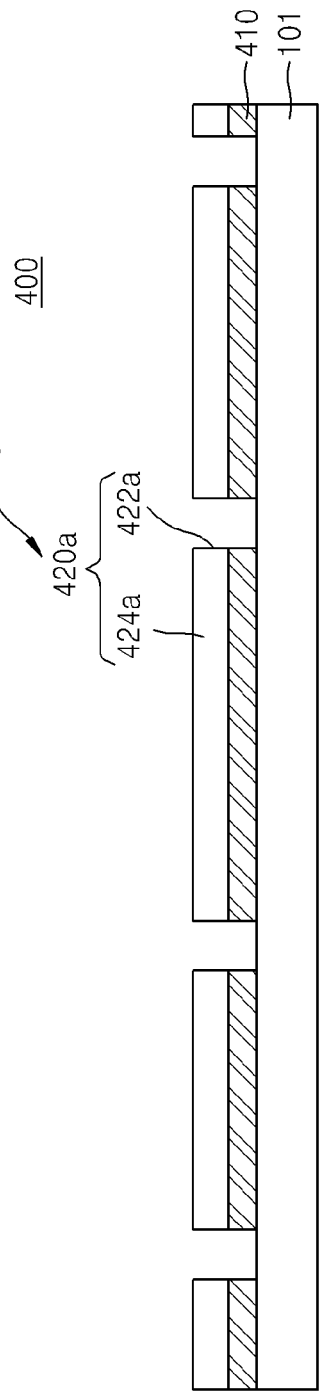

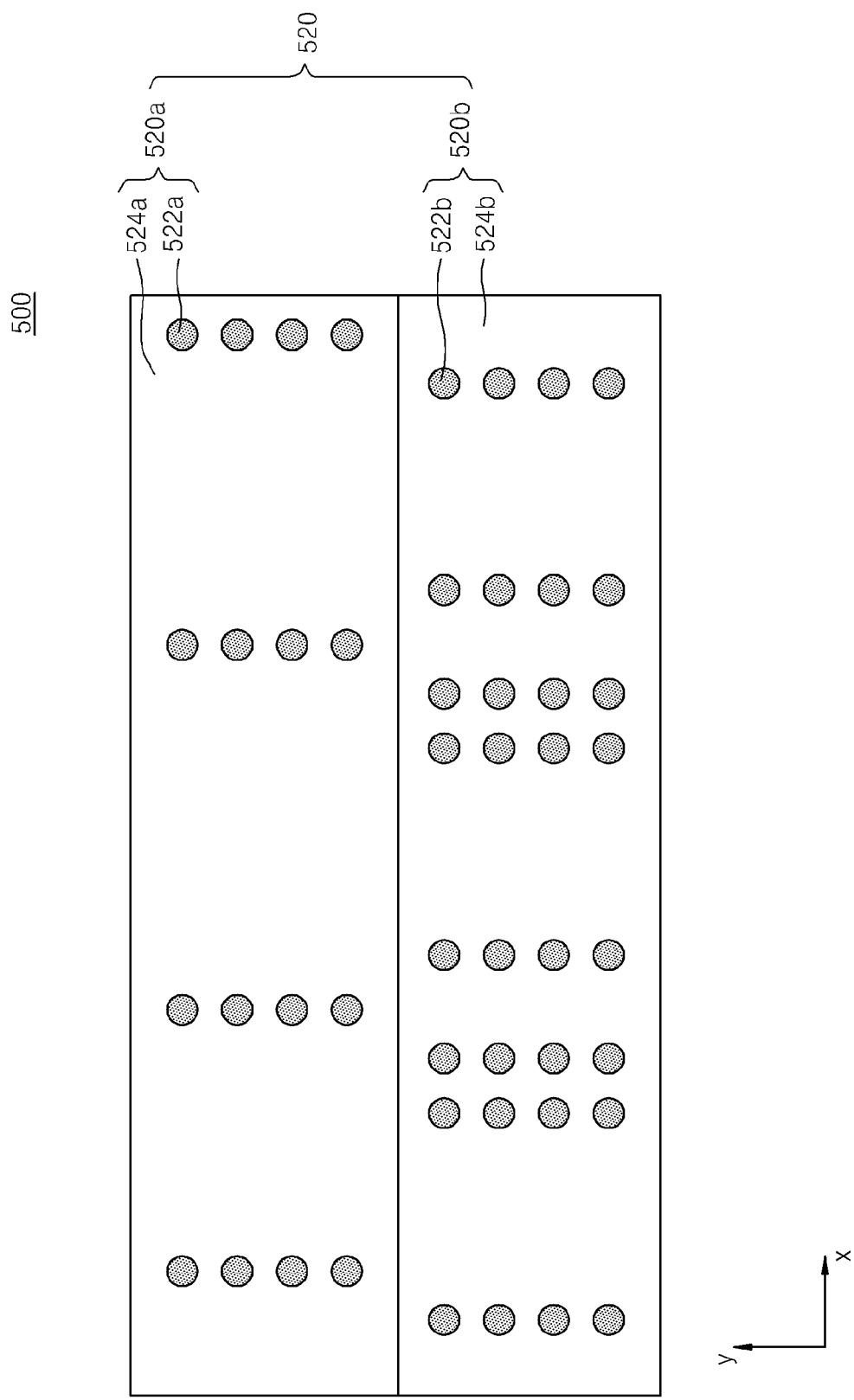

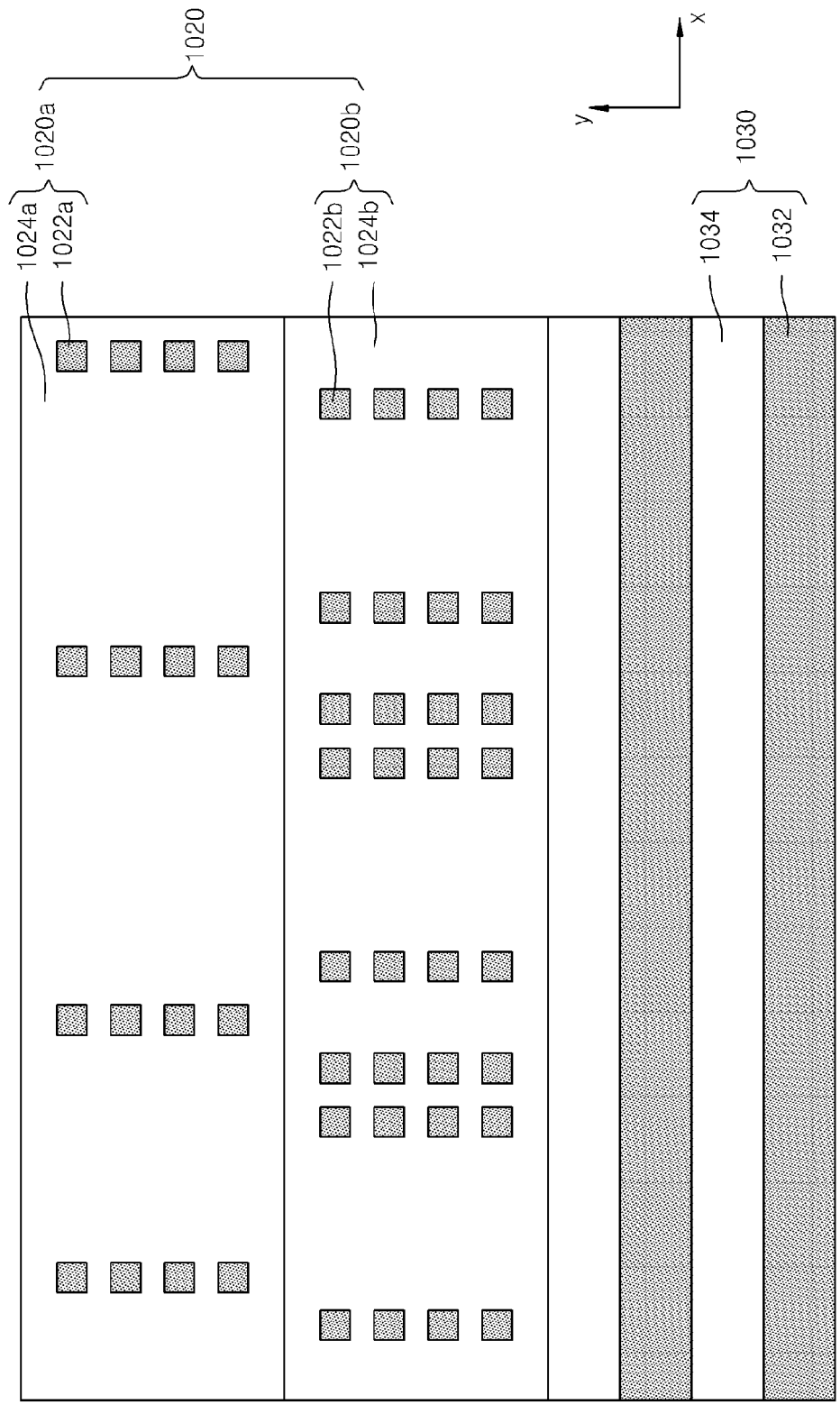

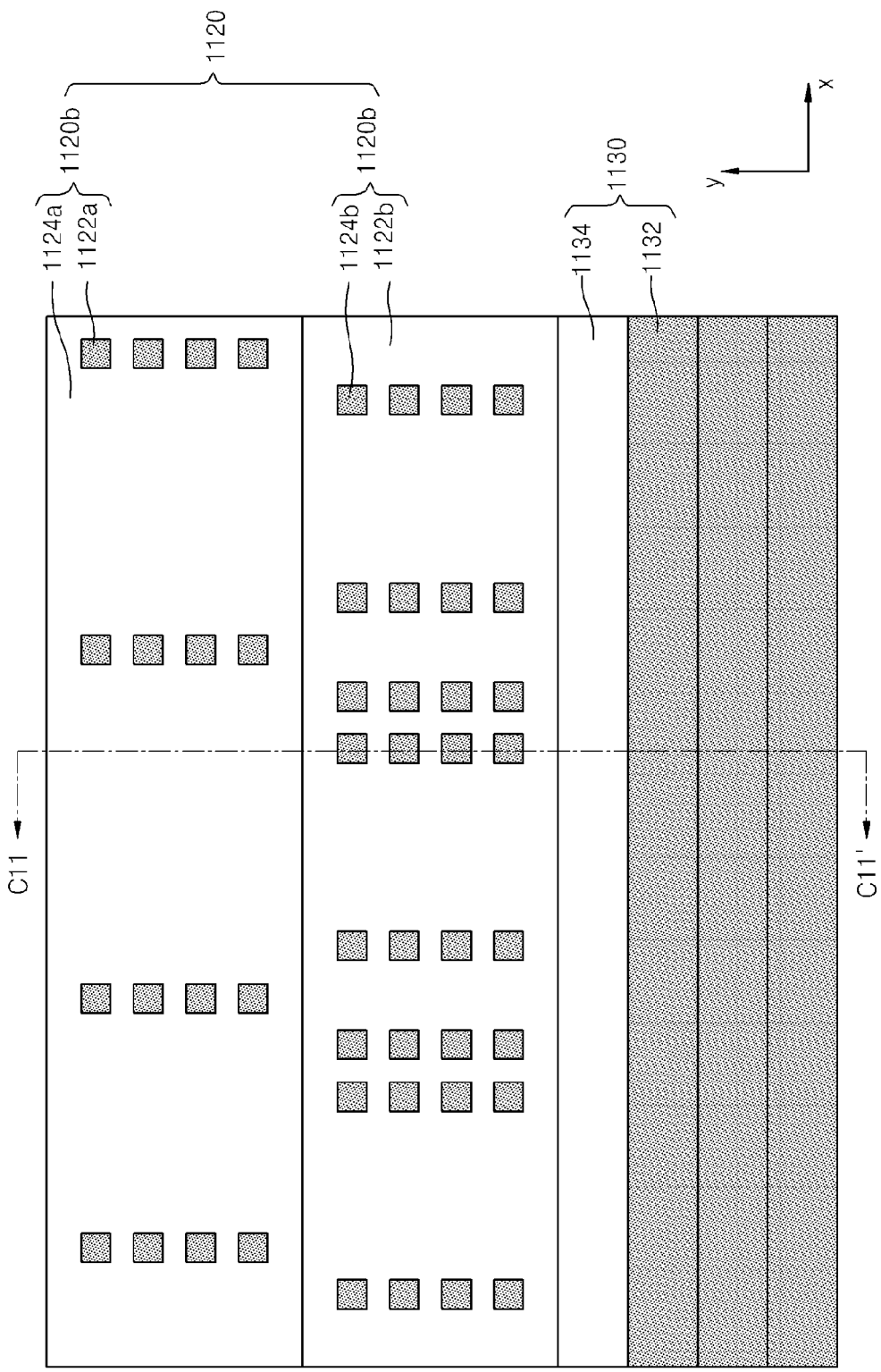

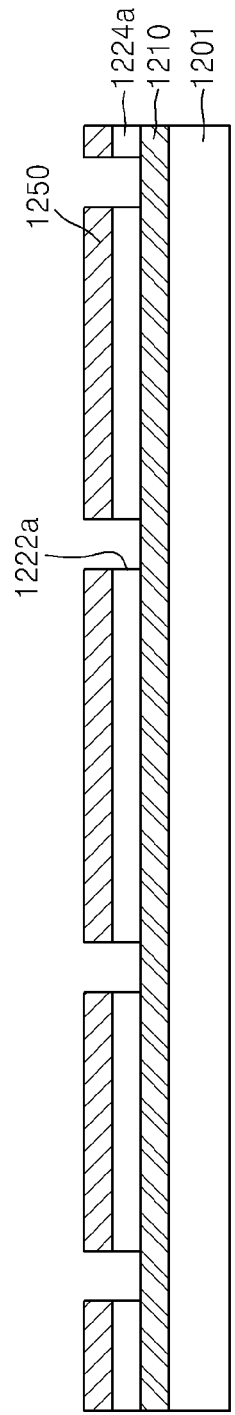
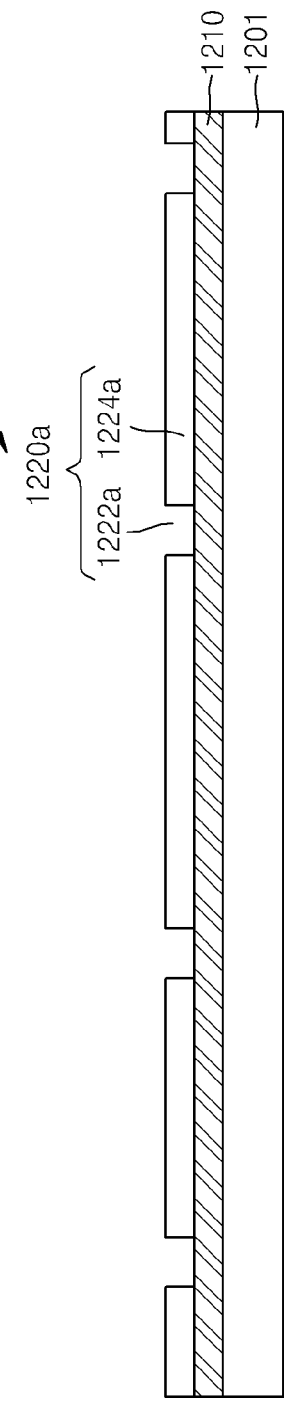

PROBE CARD INSPECTION APPARATUS

CROSS-REFERENCE TO RELATED APPLICATION

This application claims the benefit of priority to Korean Patent Application No. 10-2013-0157528, filed on Dec. 17, 2013, in the Korean Intellectual Property Office, the disclosure of which is incorporated herein in its entirety by reference.

BACKGROUND

This disclosure relates to a probe card inspection apparatus and a method of manufacturing the same, and more particularly, to a probe card inspection apparatus including a detection unit which detects defects of a probe.

When an electrical and mechanical test for a device under test (DUT) such as a semiconductor wafer is conducted by using a probe card, the test is conducted by contacting an electrode pad and a probe of the DUT. Most probe cards have tolerances even though they have the same specifications, and thus a defect inspection for each probe card is typically required before conducting the tests for the DUT.

SUMMARY

The present disclosure describes a probe card inspection wafer which is used to thoroughly and systematically conduct a defect inspection for a probe card.

According to an aspect of the inventive concept, there is provided a probe card inspection apparatus including: a substrate; a first insulating layer which covers the substrate; and a first detection unit which is formed on the first insulating layer and detects physical defects of a probe of a probe card. The first detection unit includes: a ground detection unit including a first conductive pattern which defines a plurality of openings which expose a portion of the first insulating layer and detect defects of a ground probe of the probe card; and a signal and power detection unit including a second conductive pattern which defines a plurality of openings which expose another portion of the first insulating layer and detect defects of a signal and power supply probe of the probe card.

Each of the plurality of openings defined by the first conductive pattern may be formed at a location corresponding to a location where the ground probe of the probe card is disposed, and each of the plurality of openings defined by the second conductive pattern may be formed at a location corresponding to a location where the signal and power supply probe of the probe card is disposed.

Each of the plurality of openings defined by the first conductive pattern may be formed to be separated in a first direction, and each of the plurality of openings defined by the second conductive pattern may be formed to be separated in the first direction.

Each of the plurality of openings defined by the first conductive pattern and each of the plurality of openings defined by the second conductive pattern may have a rectangular shape of which a length of a side along the first direction is different from a length of a side along a second direction perpendicular to the first direction.

In one embodiment, distances by which each of the plurality of openings defined by the first conductive pattern, and by which each of the plurality of openings defined by the second conductive pattern are separated in the first direction are not constant.

The probe card inspection apparatus may further include a second insulating layer formed on the plurality of openings defined by the first conductive pattern and the plurality of openings defined by the second conductive pattern.

A top surface of the second insulating layer may be disposed on the same level as a top surface of the first conductive pattern and a top surface of the second conductive pattern.

The plurality of openings defined by the first conductive pattern and the plurality of openings defined by the second conductive pattern may be formed to expose a top surface of the substrate.

The first conductive pattern and the second conductive pattern may be separated to expose a portion of a top surface of the first insulating layer.

According to another aspect of the inventive concept, there is provided a probe card inspection apparatus including: a substrate; a first insulating layer which covers the substrate; and a plurality of detection units which are formed on the first insulating layer. Each of the plurality of detection units includes a first detection unit which detects physical defects of a probe and a second detection unit which detects electrical defects of the probe. The first detection unit includes: a ground detection unit which detects defects of a ground probe and includes a first conductive pattern which defines a plurality of openings exposing a portion of the first insulating layer; and a signal and power detection unit which detects defects of a signal and power supply probe and comprises a second conductive pattern which defines a plurality of openings exposing another portion of the first insulating layer. The second detection unit includes a third conductive pattern that is formed to extend in a first direction.

The third conductive patterns formed on two detection units, which are adjacent to each other in the first direction, from among the plurality of detection units may be alternately arranged.

The first detection unit and the second detection unit may be separated to expose a portion of a top surface of the first insulating layer.

Each of the detection units may be separated from each other in order to expose a portion of a top surface of the first insulating layer.

The probe card inspection apparatus may further include arrangement pads arranged between the first detection unit and the second detection unit.

The second detection unit may include one or more third conductive patterns.

An aspect of an exemplary embodiment may provide a probe card inspection apparatus including: an insulating layer; a first conductive pattern which is formed on the insulating layer; and a second conductive pattern which is formed on the insulating layer.

The first conductive pattern includes: a plurality of first openings which are formed on a location corresponding to a location where a ground probe of a probe card is disposed. The second conductive pattern includes: a plurality of second openings which are formed on a location corresponding to a location where a signal and power supply probe of the probe card is disposed.

The plurality of first openings and the plurality of second openings may be formed to expose a top surface of the insulating layer.

An area of each of the plurality of first openings may be smaller than an area of a ground pad of a subject.

An area of each of the plurality of second openings may be smaller than an area of a signal and power supply pad of the subject.

The probe card inspection apparatus may further include a third conductive pattern which is formed on the insulating layer; and an insulating part which is defined by the third conductive pattern. The third conductive pattern may detect electrical defects of the ground probe and the signal and power supply probe.

BRIEF DESCRIPTION OF THE DRAWINGS

Exemplary embodiments of the inventive concept will be more clearly understood from the following detailed description taken in conjunction with the accompanying drawings in which:

FIG. 1G is a plan view illustrating an area G of FIG. 11A and is a plan view of a method of detecting electrical defects of a probe card by using a probe card inspection apparatus according to an embodiment of the inventive concept;

FIG. 3 is a linear cross-sectional view showing a part of a structure of a probe card inspection apparatus according to another embodiment of the inventive concept, taken along the line B2-B2' of FIG. 2A;

FIG. 4 is a linear cross-sectional view showing a part of a structure of a probe card inspection apparatus according to another embodiment of the inventive concept, taken along the line B2-B2' of FIG. 2A;

FIG. 5 is a plan view showing a part of a structure of a probe card inspection apparatus according to another embodiment of the inventive concept;

FIG. 10B is a plan view showing any one of detection units included in the probe card inspection apparatus of FIG. 10A according to another embodiment of the inventive concept;

FIG. 11C is a plan view showing any one of detection units included in the probe card inspection apparatus of FIG. 11A, according to certain embodiments;

FIGS. 12A to 12F are cross-sectional views for explaining a method of manufacturing a probe card inspection apparatus according to an embodiment of the inventive concept, which is illustrated according to a manufacturing procedure.

DETAILED DESCRIPTION OF THE EMBODIMENTS

Figure 1A:
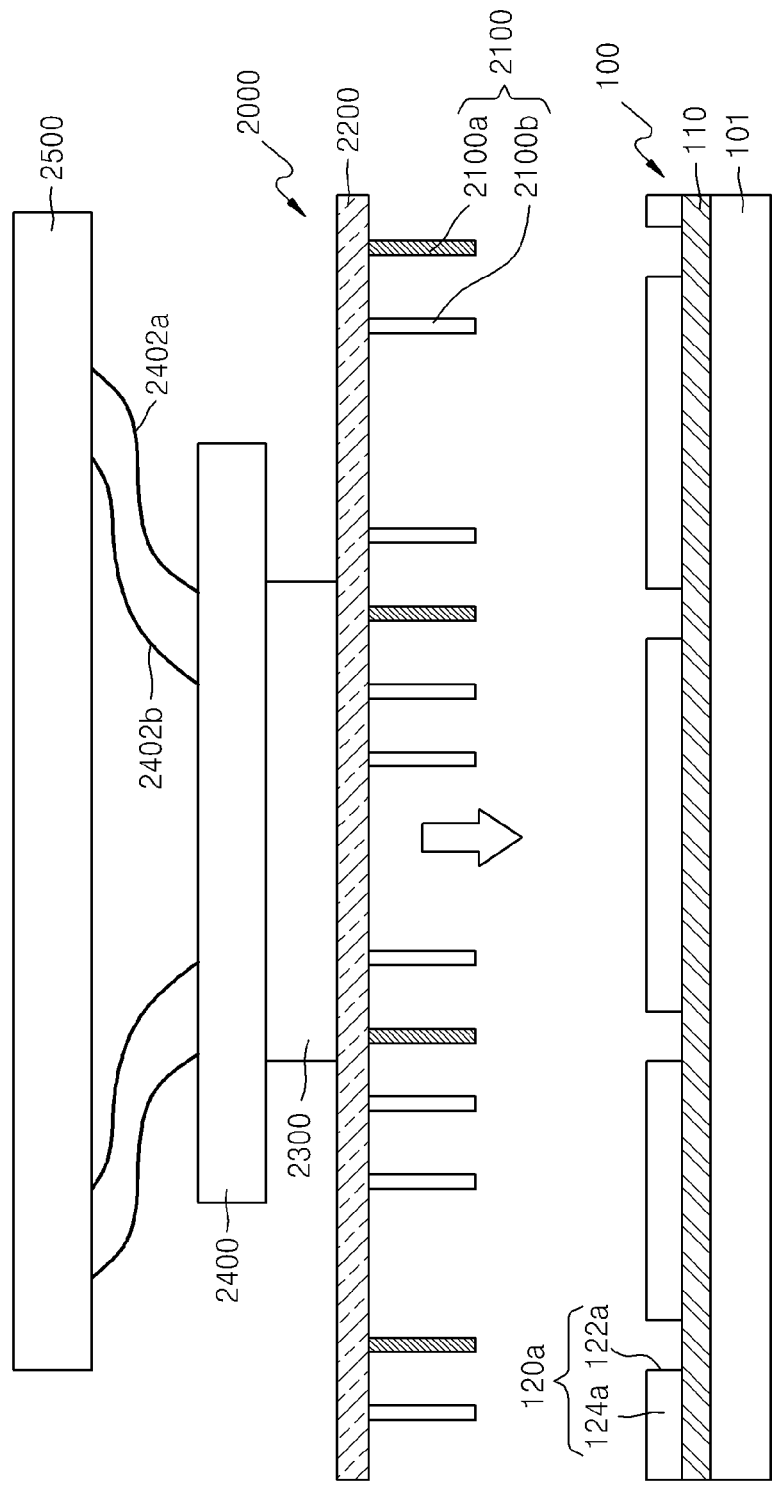
FIGS. 1A and 1B are cross-sectional views for explaining a method of detecting defects of ground probes of a probe card by using a probe card inspection apparatus according to an embodiment of the inventive concept.

Hereinafter, the disclosure will be described in detail by explaining various embodiments of the inventive concept with reference to the attached drawings. Like reference numerals in the drawings denote like elements, and thus their description will not be repeated.

The inventive concept may be embodied in many different forms and should not be construed as being limited to the embodiments set forth herein.

As used herein, the term "and/or" includes any and all combinations of one or more of the associated listed items and may be abbreviated as "/". As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

While such terms as "first," "second," etc., may be used to describe various members, areas, layers, sections and/or components, such members, areas, layers, sections and/or components should not be limited to the above terms. Unless the context indicates otherwise, the above terms are used only to distinguish one member, area, layer, section or component from another. For example, a first layer could be termed a second layer, and, similarly, a second layer could be termed a first layer without departing from the teachings of the disclosure.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. However, the term "contact," unless indicated otherwise, refers to direct contact, or touching.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A specific order of processes may not follow the order described herein. For example, two processes consecutively described herein may be simultaneously performed or may be performed in an order opposite to that described.

With reference to the attached drawings, structures described herein may be changed, for example, according to manufacturing technologies and/or manufacturing tolerances. Therefore, embodiments of the inventive concept are not limited to the structures described herein. For example, the embodiments should include changes that may occur in structures during manufacturing procedures.

Figure 1B:
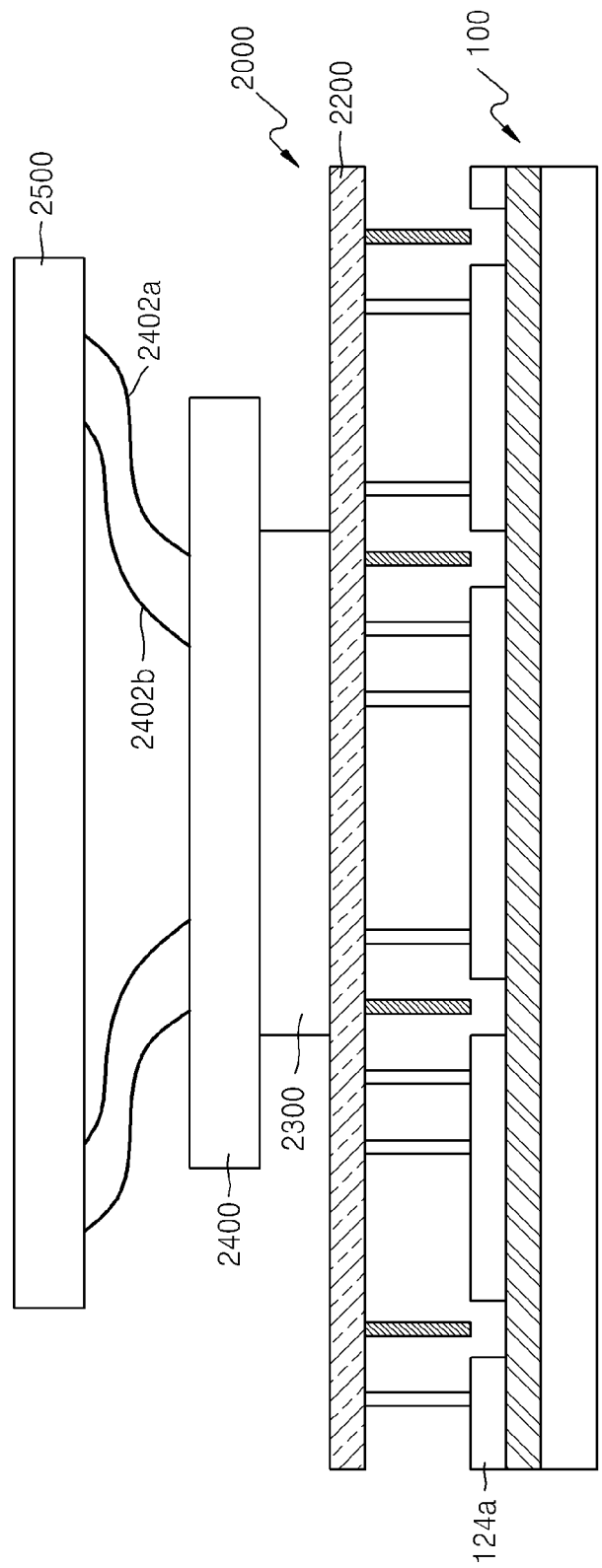

FIGS. 1A and 1B are cross-sectional views for explaining a method of detecting defects of ground probes 2100a of a probe card 2000 by using a probe card inspection apparatus 100 according to an embodiment of the inventive concept.

In terms of probe card inspection, ground probe inspection (FIGS. 1A through 1D), signal and power supply probe inspection (FIGS. 1E and 1F), and electrical defect inspection (FIGS. 1G and 1H) determine relative locations of the probe card 2000 and the probe card inspection apparatus 100 and are separately conducted. In this regard, an order of conducting the inspections may be arbitrarily determined. The relative locations of the probe card 2000 and the probe card inspection apparatus 100 may be determined based on, for example, a movement of a wafer chuck which supports a subject or the probe card inspection apparatus 100.

Referring to FIG. 1A, the probe card 2000 includes probes 2100, a probe card substrate 2200 on which the probes 2100 are disposed, a coaxial board 2400 housing a coaxial cable (not shown) for supplying an inspection current to the probes 2100 and an interposer 2300, which is a medium which is interposed between the probe card substrate 2200 and the coaxial board 2400 and supplies the inspection current to the probes 2100. The probe card 2000 may be connected to a tester (not shown), which generates the inspection current through a performance board 2500.

In the present embodiment, the probe card 2000 is described to explain a method of inspecting the probe card inspection apparatus 100, and may have a different structure and form.

Each of the probes 2100 includes a ground probe 2100a and a signal and power supply probe 2100b. In general, the probe card substrate 2200 may be arranged on a top surface of a subject (not shown) for inspecting the subject (not shown).

In the present embodiment, however, the probe card substrate 2200 is arranged on a top surface of the probe card inspection apparatus 100 in order to inspect the probe card 2000.

The interposer 2300 is arranged on the probe card 2200. The probe card substrate 2200 may have a structure in which a plurality of insulating substrates are arranged. The insulating substrates are formed of, for example, ceramic. A circuit pattern (not shown) exposed through a top surface and a bottom surface of the probe card substrate 2200 is housed in the probe card substrate 2200. The circuit pattern (not shown) arranged on the top surface of the probe card substrate 2200 is electrically connected to signal lines (not shown) of the interposer 2300.

The probes 2100 that contact the probe card inspection apparatus 100 are electrically connected to the circuit pattern (not shown) arranged on the bottom surface of the probe card substrate 2200. Therefore, the probes 2100 are electrically connected to the signal lines (not shown) of the interposer 2300 through the circuit pattern.

The coaxial board 2400 is arranged on the interposer 2300. The coaxial board 2400 includes a transmission medium, such as coaxial signal cables 2402b and coaxial ground cables 2402a. Each of the coaxial signal cables 2402b is electrically connected to each of the signal and power supply probes 2100b through the signal lines of the interposer 2300. The coaxial ground cables 2402a are electrically connected to the ground probes 2100a through ground lines (not shown) of the interposer 2300, respectively.

The performance board 2500 which transmits the inspection current generated from the tester (not shown) to the coaxial ground cables 2402b is arranged on a top surface of the coaxial board 2400.

Figure 2A:
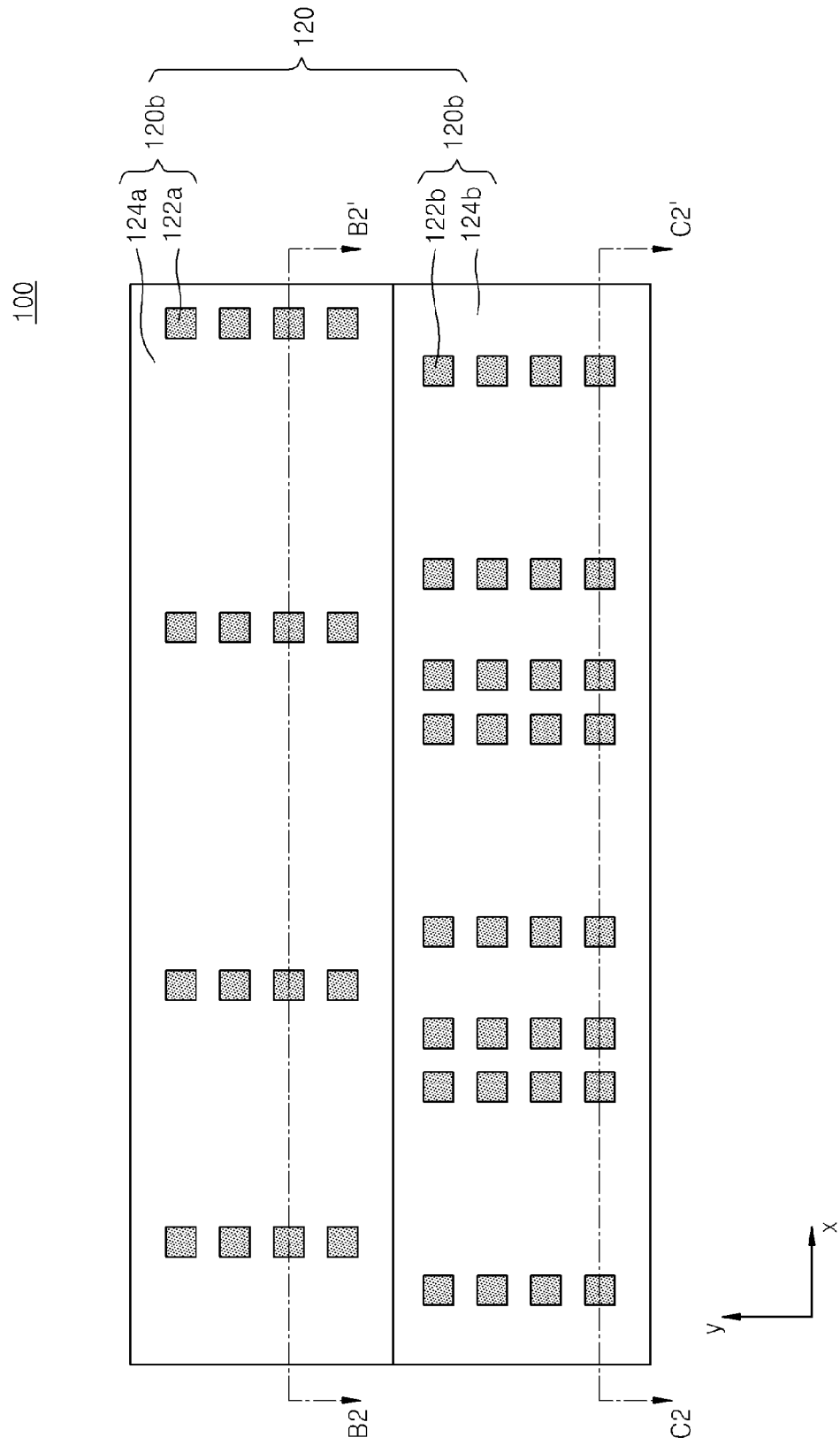
FIG. 2A is a plan view showing a part of a structure of a probe card inspection apparatus according to an embodiment of the inventive concept.
Figure 2B:
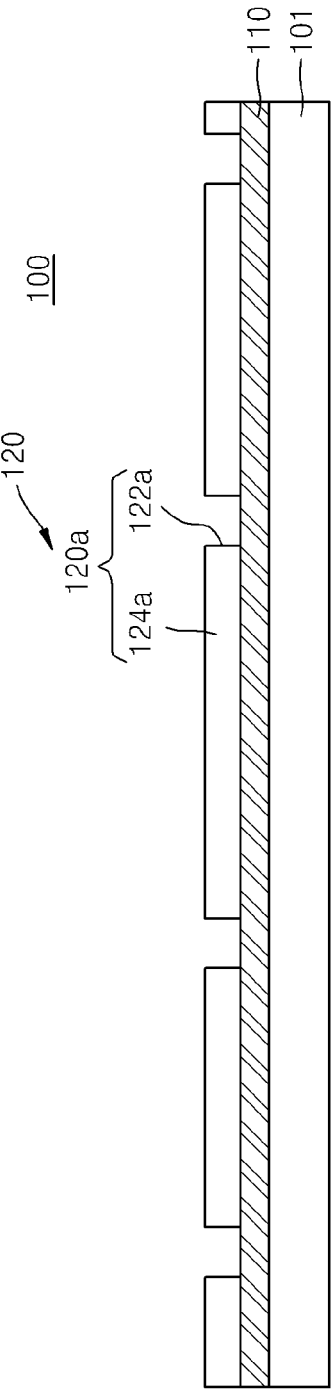
FIG. 2B is an exemplary cross-sectional view of FIG. 2A, taken along a line B2-B2' of FIG. 2A.
Figure 2C:
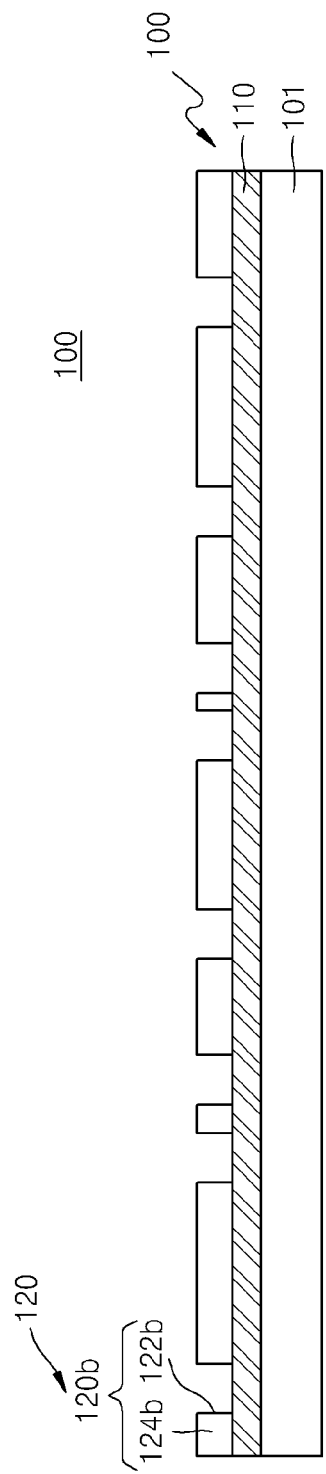
FIG. 2C is an exemplary cross-sectional view of FIG. 2A, taken along a line C2-C2' of FIG. 2A.

The probe card inspection apparatus 100 includes a substrate 101, a first insulating layer 110 and ground detection units 120a including first conductive patterns 124a which define openings 122a (refer to FIGS. 2A through 2C). The detailed description regarding a structure of the probe card inspection apparatus 100 will be given later in detail with reference to FIGS. 2A through 2C.

The openings 122a may be formed in locations where ground pads of the subject (not shown) are arranged. For example, the locations of the openings 122a may vary according to a structure of the subject (not shown).

With regard to inspection of the subject (not shown), the ground probes 2100a of the probe card 2000 contact the ground pads (not shown) of the subject. When a location of each ground probe 2100a does not exactly correspond to that of each ground pad of the subject, defects of the subject might not be accurately detected through the probe card 2000. Therefore, in the present embodiment, inspection involving checking whether the location of each ground probe 2100a exactly corresponds to that of each ground pad of the subject may be conducted.

Referring to FIG. 1B, the probe card 2000 contacts the probe card inspection apparatus 100. Referring to FIG. 1B in more detail, the signal and power supply probes 2100b of the probe card 2000 physically contact the first conductive patterns 124a of the probe card inspection apparatus 100.

When the ground probes 2100a of the probe card 2000 are normally disposed, the ground probes 2100a are disposed in the openings 122a and are in an open state.

However, when ground probes 2100a of the probe card 2000 are not normally disposed, the ground probes 2100a are disposed on the first conductive patterns 124a and are in a closed state. Accordingly, whether the ground probes 2100a of the probe card 2000 are normally disposed may be inspected.

Figure 1C:
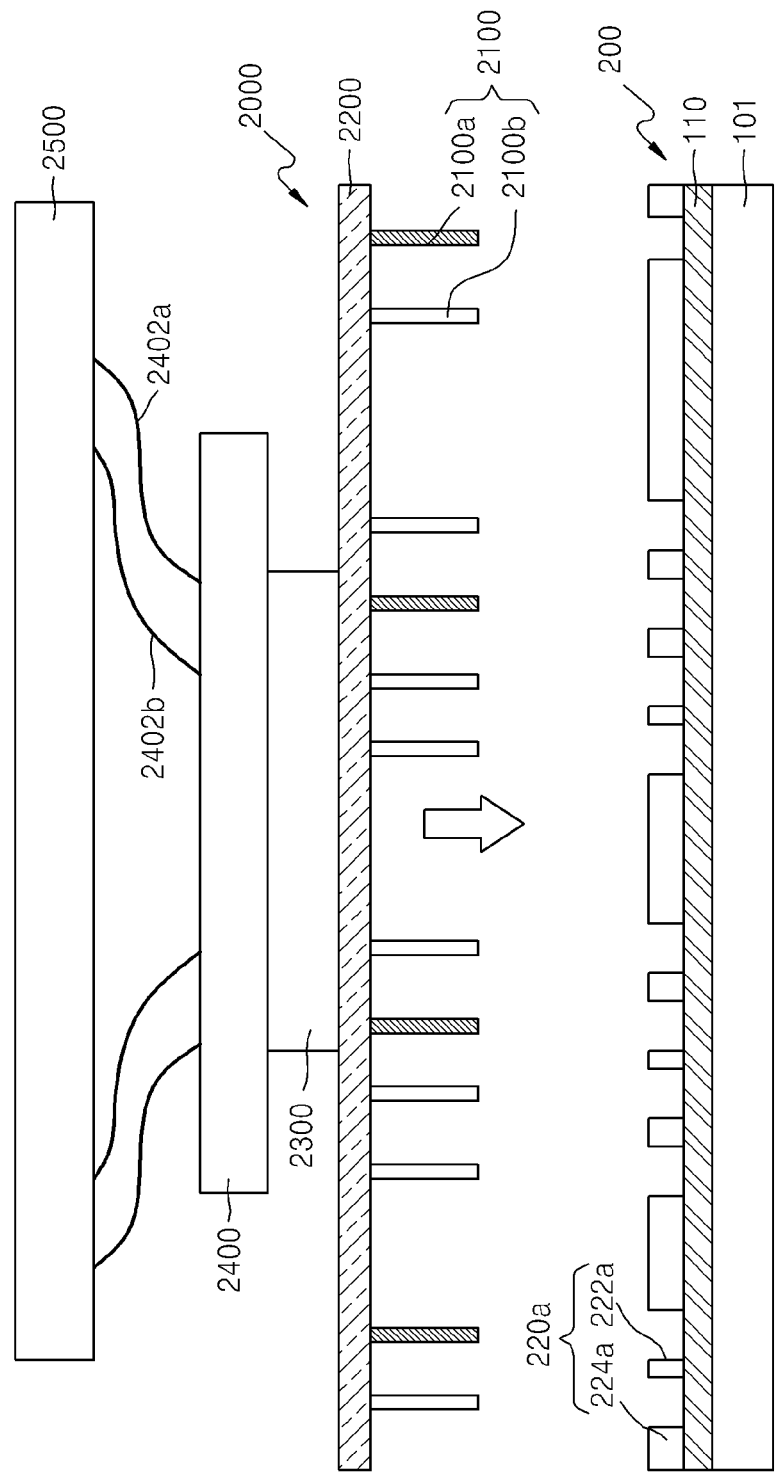
FIGS. 1C and 1D are cross-sectional views for explaining a method of detecting defects of ground probes of a probe card by using a probe card inspection apparatus according to another embodiment of the inventive concept.
Figure 1D:
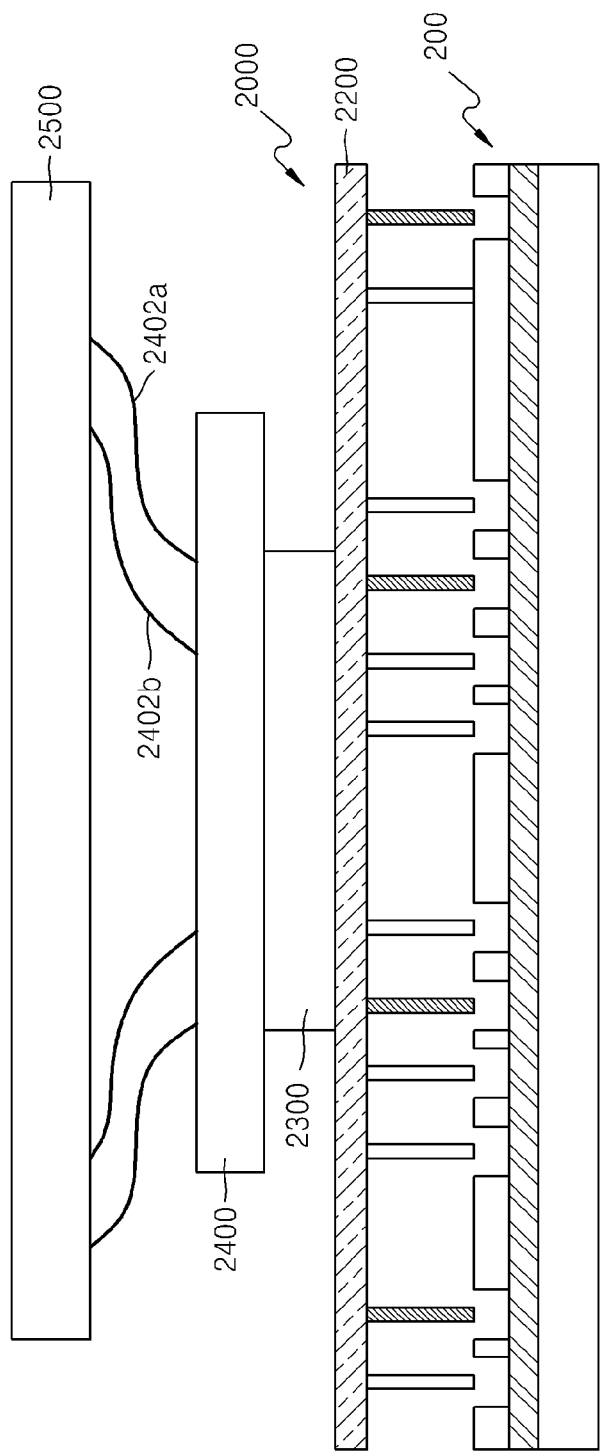

FIGS. 1C and 1D are cross-sectional views for explaining a method of detecting defects of the ground probes 2100a of the probe card 2000 by using a probe card inspection apparatus 200 according to another embodiment of the inventive concept.

Referring to FIG. 1C, the probe card 2000 includes the same components included in the probe card 2000 of FIG. 1A. Therefore, like reference numerals in the drawings denote like elements, and thus their description will not be repeated. In the present embodiment, the probe card 2000 is described to explain a method of inspecting the probe card inspection apparatus 100, and may have a different structure and form.

The probe card inspection apparatus 200 includes the substrate 101, the first insulating layer 110 and ground detection units 220a including first conductive patterns 224a which define openings 222a. The probe card inspection apparatus 200 has a similar structure to the probe card inspection apparatus 100, but the openings 222a of the probe card inspection apparatus 200 are formed in different locations from the openings 122a of the probe card inspection apparatus 100.

The openings 222a are formed in locations where the ground pads of the subject (not shown) are disposed and on locations where pads, which exclude a signal pad that is arbitrarily selected from among signal and power supply pads of the subject (not shown), are disposed. For example, as shown in FIGS. 1A and 1B, the locations of the openings 222a may vary according to a structure the subject (not shown).

Referring to FIG. 1D, the probe card 2000 contacts the probe card inspection apparatus 200. Referring to FIG. 1D in more detail, a signal probe that is arbitrarily selected from among the signal and power supply probes 2100b of the probe card 2000 physically contacts one of the first conductive patterns 224a of the probe card inspection apparatus 200.

When the ground probes 2100a of the probe card 2000 are normally disposed, the ground probes 2100a are disposed in the openings 222a and are in the open state.

However, when the ground probes 2100a of the probe card 2000 are not normally disposed, the ground probes 2100a are disposed on the first conductive patterns 224a and are in the closed state. Accordingly, whether the ground probes 2100a of the probe card 2000 are normally disposed may be inspected.

Figure 1E:
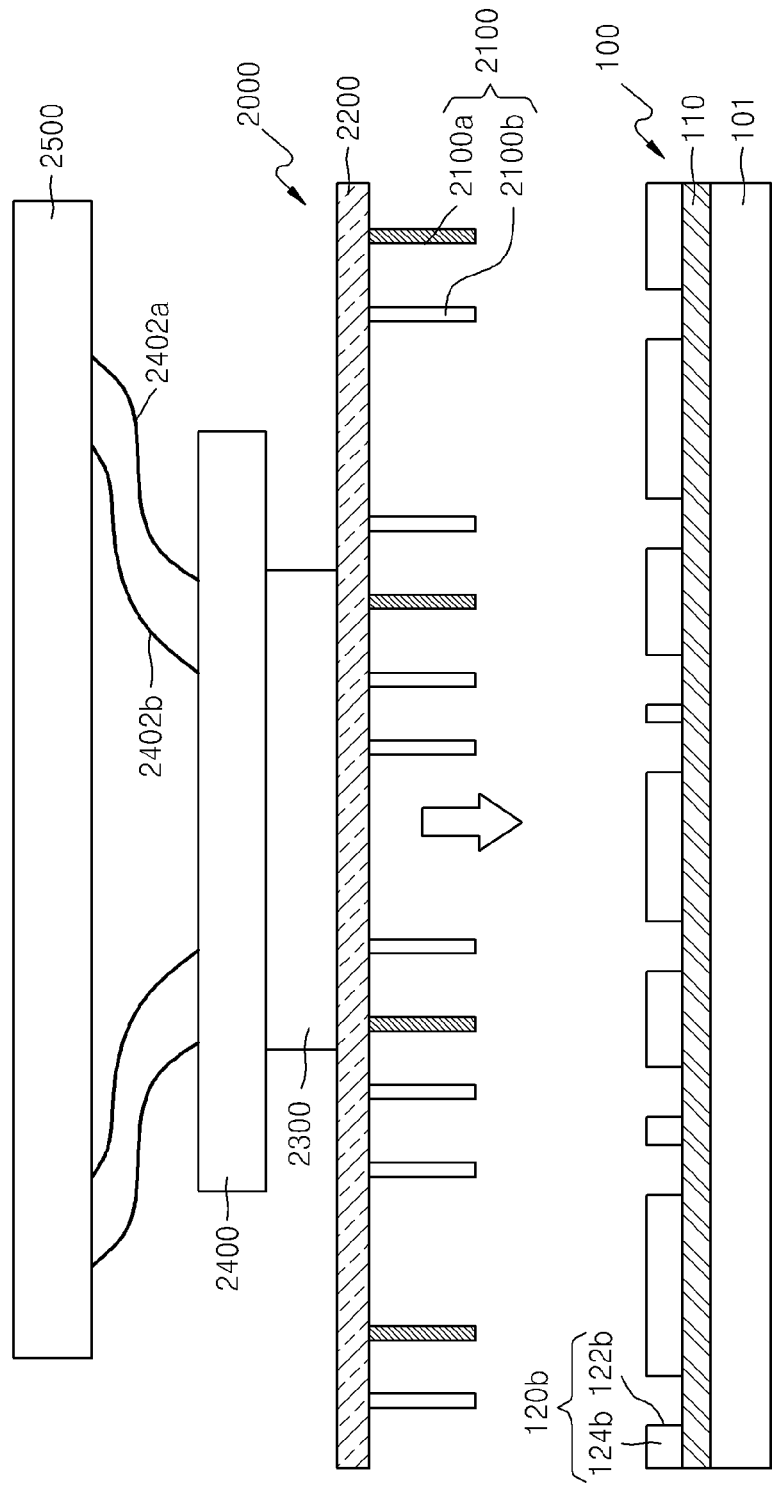
FIGS. 1E and 1F are cross-sectional views for explaining a method of detecting defects of signal and power supply probes of a probe card by using a probe card inspection apparatus according to an embodiment of the inventive concept.
Figure 1F:
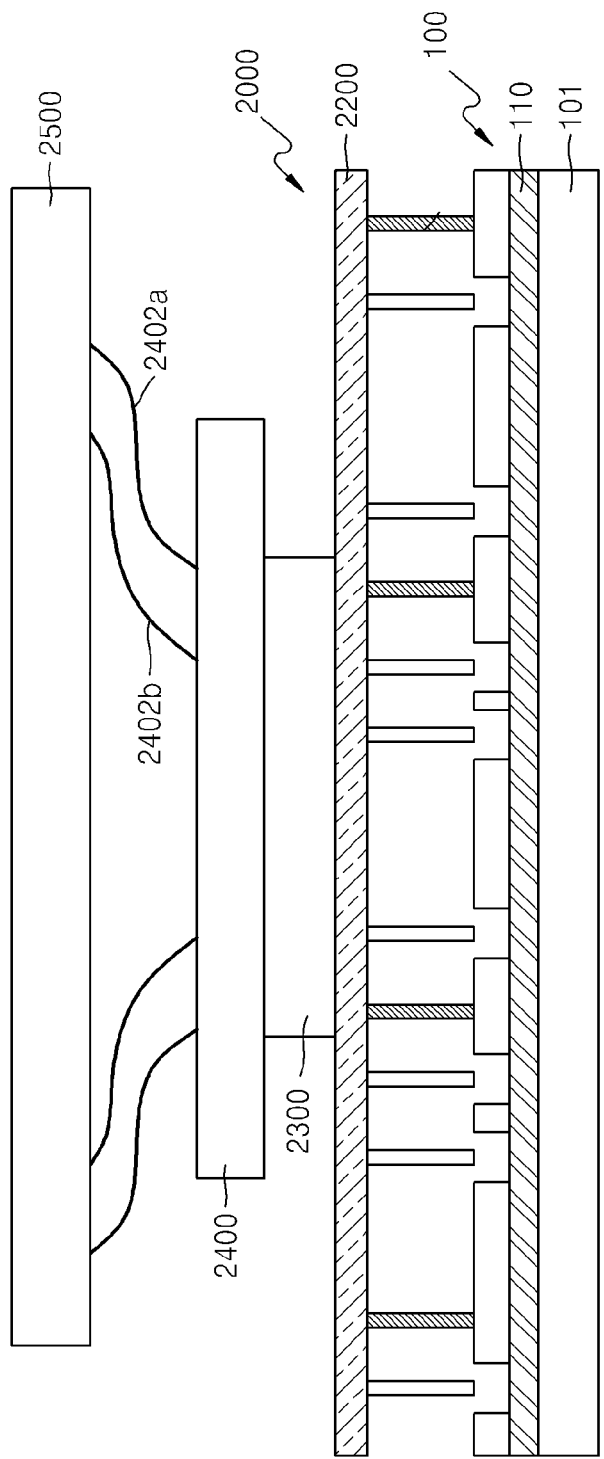

FIGS. 1E and 1F are cross-sectional views for explaining a method of detecting defects of signal and power supply probes 2100b of the probe card 2000 by using the probe card inspection apparatus 100 according to an embodiment of the inventive concept.

Referring to FIG. 1E, the probe card 2000 includes the same components included in the probe card 2000 described with reference to FIGS. 1A through 1D. Therefore, like reference numerals in the drawings denote like elements, and thus their description will not be repeated. In the present embodiment, the probe card 2000 is described to explain the method of inspecting the probe card inspection apparatus 100, and thus may have a different structure and form.

The probe card inspection apparatus 100 includes a substrate 101, a first insulating layer 110 and signal and power detection units 120b including second conductive patterns 124b which define openings 122b (refer to FIGS. 2A through 2C).

The openings 122b are formed in locations where signal and power supply pads of the subject (not shown) are disposed. For example, as shown in FIGS. 1A through 1D, the locations of the openings 122b may vary according to the structure of the subject (not shown).

Referring to FIG. 1F, the probe card 2000 contacts the probe card inspection apparatus 100. In detail, the ground probes 2100a of the probe card 2000 contact the second conductive patterns 124b of the probe card inspection apparatus 100.

When the signal and power supply probes 2100b of the probe card 2000 are normally disposed, the signal and power supply probes 2100b are disposed in the openings 122b and are in the open state.

When the signal and power supply probes 2100b of the probe card 2000 are not normally disposed, the signal and power supply probes 2100b are disposed on the second conductive patterns 124b and are in the closed state. Accordingly, whether the signal and power supply probes 2100b of the probe card 2000 are normally disposed may be inspected.

Figure 1H:
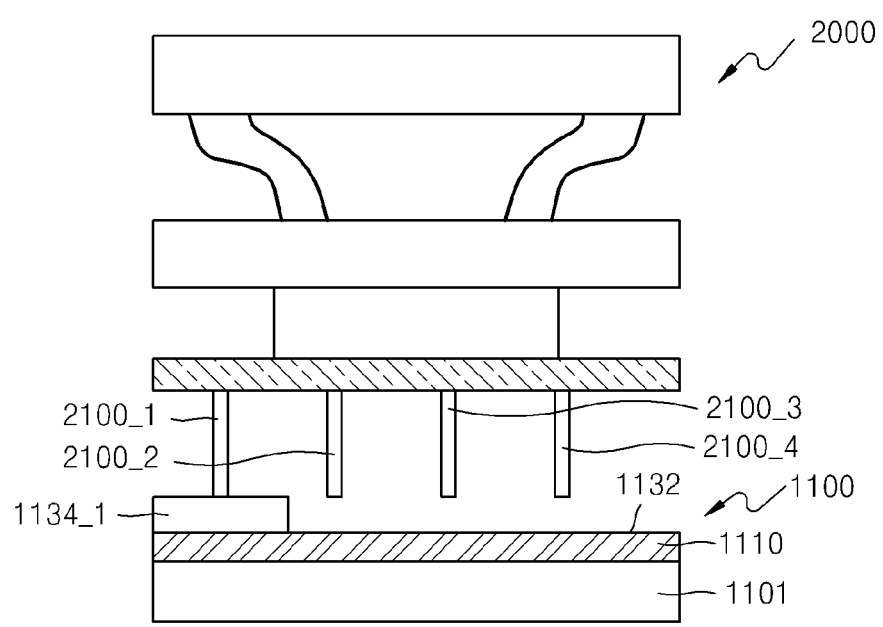
FIG. 1H is a cross-sectional view of the probe card inspection apparatus of FIG. 1G, taken along a line H1-H1' of FIG. 1G.
Figure 11A:
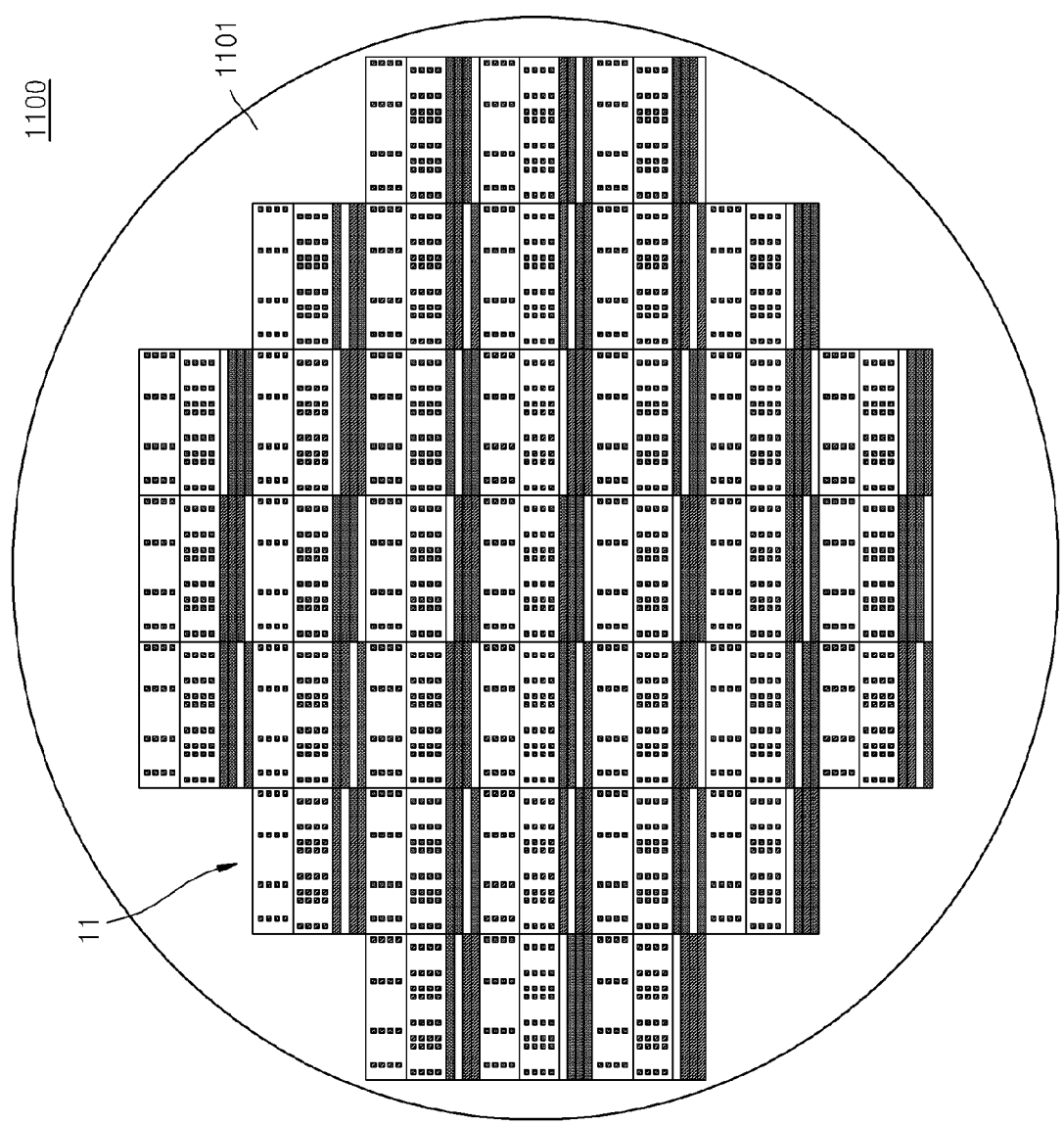
FIGS. 11A and 11B are plan views showing some parts of a structure of a probe card inspection apparatus according to another embodiment of the inventive concept.

FIG. 1G is a plan view illustrating an area G of FIG. 11A and is a plan view of a method of detecting electrical defects of the probe card 2100 by using a probe card inspection apparatus 1100 according to an embodiment of the inventive concept. FIG. 1H is an exemplary cross-sectional view of the probe card inspection apparatus 1100 of FIG. 1G, taken along a line H1-H1' of FIG. 1G.

Referring to FIGS. 1G and 1H, each of the probes 2100 includes probes of a first group 2100_1, probes of a second group 2100_2, probes of a third group 2100_3 and probes of a fourth group 2100_4.

The probe card inspection apparatus 1100 includes detection units 11 (refer to FIGS. 11A through 11C), and each of the detection units 11 includes a second detection unit 1130 which detects electrical defects of the probes 2100. Each second detection unit 1130 includes one of third conductive patterns 1134_1 through 1134_4 which define insulating parts 1132 that expose portions of the first insulating layers 1110 (refer to FIGS. 11A through 11C).

The third conductive patterns 1134_1 through 1134_4 may be collectively referred to as the third conductive pattern 1134. The third conductive patterns 1134 contact the probes of the first through fourth groups 2100_1 through 2100_4, respectively.

The third conductive patterns 1134 respectively contact the probes of the first through fourth groups 2100_1 through 2100_4 and detect electrical defects of each of the probes of the first through fourth groups 2100_1 through 2100_4.

A structure of the probe card inspection apparatus 1100 will be later described in detail with reference to FIGS. 11A through 11C.

The probe card 2000 contacts the second detection units 1130 of the probe card inspection apparatus 1100. The probes of the first group 2100_1 contact the third conductive pattern 1134_1 and are electrically closed, and the probes of the first through third groups 2100_2 through 2100_4 are disposed on the insulating parts 1132 and are electrically open.

Accordingly, although the probes of the first through fourth groups 2100_1 through 2100_4 are combined, whether the interposer 2300 and the probes 2100 have defects may be checked in each test group, and whether grouping of relays is normally performed may also be checked.

In FIG. 1H, the probes of the first group 2100_1 are subject to inspection, but according to locations where the third conductive patterns 1134 are formed, the probes of the second through fourth groups 2100_2 through 2100_4 may also be subject to inspections. The locations where the third conductive patterns 1134 may be determined according to the structure of the subject (not shown).

FIG. 2A is a plan view showing a part of a structure of the probe card inspection apparatus 100 according to an embodiment of the inventive concept, and FIG. 2B is an exemplary cross-sectional view of FIG. 2A, taken along a line B2-B2' of FIG. 2A. FIG. 2C is an exemplary cross-sectional view of FIG. 2A, taken along a line C2-C2' of FIG. 2A.

Referring to FIGS. 2A through 2C, the probe card inspection apparatus 100 includes a substrate 101, a first insulating layer 110 and first detection units 120.

In some embodiments, the substrate 101 may include, for example, crystalline silicon (Si), polycrystalline Si or amorphous Si. In other embodiments, the substrate 101 may include a semiconductor such as a germanium (Ge) semiconductor, or a compound semiconductor such as an SiGe semiconductor, a silicon carbide (SiC) semiconductor, a gallium arsenide (GaAs) semiconductor, an indium arsenide (InAs) semiconductor and an indium phosphide (InP) semiconductor.

In some embodiments, the first insulating layer 110 may be formed of a silicon nitride film, a silicon oxide film or a combination thereof.

The first detection units 120 are formed on the first insulating layer 110 and detect physical defects of the probes 2100. Each of the first detection units 120 includes a ground detection unit 120a which detects defects of the ground probes 2100a and a signal and power detection unit 120b which detects defects of the signal and power supply probes 2100b.

The ground detection unit 120a includes the first conductive pattern 124a which defines the openings 122a exposing a portion of the first insulating layer 110.

In some embodiments, each of the openings 122a defined by the first conductive pattern 124a may be formed to be separated in a first direction (an X direction of FIG. 2A). Since each of the openings 122a may be formed in a location where a ground pad of the subject (not shown) is disposed, a distance by which each of the openings 122a defined by the first conductive pattern 124a is separated in the first direction (the X direction of FIG. 2A) may not be constant.

In some embodiments, each of the openings 122a defined by the first conductive pattern 124a may have a rectangular shape of which a length of a side along the first direction (the X direction of FIG. 2A) is different from a length of a side along a second direction (a Y direction of FIG. 2A), but is not limited thereto. Each of the openings 122a may have a square shape of which the length of the side along the first direction is the same as the length of the side along the second direction. In another embodiment, each of the openings 122a may have a polygonal form.

An area of each opening 122a may be smaller than an area of the ground pad of the subject (not shown). The area of each opening 122a may be about 15% of the area of the ground pad of the subject (not shown). In general, a side of each opening 122a may be about 40 to about 50 μm. Since each opening 122a is smaller than the ground pad of the subject (not shown), a location of each ground probe 2100a may be exactly detected.

Each of the first conductive patterns 124a defines each opening 122a and is formed on the first insulating layer 110.

In some embodiments, each of the first conductive patterns 124a is formed of doped polysilicon, a metal, a conductive metal nitride, a conductive silicide, an alloy or a combination thereof. For example, the first conductive pattern 124a may be formed of at least one metal nitride selected from the group consisting of aluminum (Al), titanium (Ti), tantalum (Ta), tungsten (W), Ru (ruthenium), Nb (niobium), Mo (molybdenum) and hafnium (Hf). Also, the first conductive pattern 124a may have a single-layer or multi-layer structure. In some embodiments, the first conductive pattern 124a is formed by chemical vapor deposition (CVD), metal organic CVD (MOCVD), atomic layer deposition (ALD) or metal organic ALD (MOALD), but is not limited thereto.

A manufacturing procedure of the probe card inspection apparatus 100 will be described later in detail with reference to FIGS. 12A through 12F.

Each of the signal and power detection unit 120b includes the second conductive pattern 124b which defines each opening 122b exposing a portion of the first insulating layer 110.

Each opening 122b defined by the second conductive pattern 124b may be formed to be separated in the first direction (the X direction of FIG. 2A). Each opening 122b may be formed in a location where a signal and power supply pad of the subject (not shown) is disposed. Thus, in certain embodiments, a distance by which each opening 122b defined by the second conductive pattern 124b is separated in the first direction (the X direction of FIG. 2A) is not constant.

Each opening 122b defined by the second conductive pattern 124b may have a rectangular shape of which a length of a side along the first direction is different from a length of a side along the second direction, but is not limited thereto. Each opening 122b may have a square shape of which the length of the side along the first direction is the same as the length of the side along the second direction.

An area of each opening 122b may be smaller than an area of the signal and power supply pad of the subject (not shown). For example, the area of each opening 122b may be about 15% of the area of the signal and power supply pad of the subject (not shown). In certain embodiments, a side of each opening 122b may be about 40 to about 50 μm. Since each opening 122b is smaller than the signal and power supply pad of the subject (not shown), a location of each signal and power supply probe 2100b may be exactly detected.

Each of the second conductive patterns 124b defines each opening 122b and is formed on the first insulating layer 110.

In some embodiments, each of the second conductive patterns 124b is formed of doped polysilicon, a metal, a conductive metal nitride, a conductive silicide, an alloy or a combination thereof. For example, the first conductive pattern 124a may be formed of at least one metal nitride selected from the group consisting of Al, Ti, Ta, W, Ru, Nb, Mo and Hf. Also, the second conductive pattern 124b may have a single-layer or multi-layer structure.

FIG. 3 is a linear cross-sectional view showing a part of a structure of a probe card inspection apparatus 300 according to another embodiment of the inventive concept, which corresponds to the line B2-B2' of FIG. 2A. In FIG. 3, as shown in FIGS. 1A through 2C, like reference numerals in the drawings denote like elements, and thus their description will be omitted for convenience of explanation.

The probe card inspection apparatus 300 has a similar structure to the probe card inspection apparatus 100 of FIG. 2A, and thus their differences will be described with reference to the linear cross-sectional view of FIG. 3 corresponding to the line B2-B2' of FIG. 2A.

Referring to FIG. 3, the probe card inspection apparatus 300 includes a substrate 101, a first insulating layer 110 and first detection units (not shown).

Each of the first detection units (not shown) includes a ground detection unit 320a which detects defects of a ground probe and a signal and power detection unit (not shown) which detects defects of a signal and power supply probe.

The ground detection unit 320a includes a first conductive pattern 324a and a second insulating layer 330a.

The second insulating layer 330a may be formed of a silicon nitride film, a silicon oxide film or a combination thereof. In some embodiments, the second insulating layer 330a may be formed of the same material as in the first insulating layer 110. However, the second insulating layer 330a may be formed of a different material.

In some embodiments, the second insulating layer 330a may be formed to be separated in the first direction (the X direction of FIG. 2A). Since the second insulating layer 330a may be formed on a location where a ground pad of the subject (not shown) is disposed, a distance by which the second insulating layer 330a is separated in the first direction might not be constant.

In some embodiments, the second insulating layer 330a may have a rectangular shape of which a length of a side along the first direction (the X direction of FIG. 2A) is different from a length of a side along the second direction (the Y direction of FIG. 2A), but is not limited thereto. The second insulating layer 330a may have a square shape of which the length of the side along the first direction is the same as the length of the side along the second direction.

An area of the second insulating layer 330a may be smaller than an area of the ground pad of the subject (not shown). For example, the area of the second insulating layer 330a may be about 15% of the area of the ground pad of the subject (not shown). In certain embodiments, a side of the second insulating layer 330a may be about 40 to about 50 μm.

The first conductive patterns 324a defines the second insulating layer 330a and is formed on the first insulating layer 110.

In some embodiments, the first conductive patterns 324a is formed of doped polysilicon, a metal, a conductive metal nitride, a metal silicide, an alloy or a combination thereof.

The signal and power detection unit is not described in FIG. 3, but in one embodiment it includes a second conductive pattern (not shown) and a second insulating layer (not shown), which is similar to the ground detection unit 320a. With reference to FIGS. 2A to 3, a structure of the signal and power detection unit of the probe card inspection apparatus 300 could have different configurations based on certain conventional technologies, and thus the descriptions will be omitted for convenience of explanation.

FIG. 4 is a linear cross-sectional view showing a part of a structure of a probe card inspection apparatus 400 according to another embodiment of the inventive concept, taken along the line B2-B2' of FIG. 2A. In FIG. 4, like reference numerals in the drawings denote like elements as shown in FIGS. 1A through 3, and thus their description will be omitted for convenience of explanation.

According to the above-described plan view, the probe card inspection apparatus 400 has a structure similar to that of the probe card inspection apparatus 100 of FIG. 2A, and thus, in the present embodiment, their differences will be described with reference to the linear cross-sectional view taken along the line B2-B2' of FIG. 2A.

Referring to FIG. 4, the probe card inspection apparatus 400 includes a substrate 101, a first insulating layer 410, and first detection units 420.

Each of the first detection units 420 includes a ground detection unit 420a and a signal and power detection unit (not shown) which detects defects of a signal and power supply probe.

The ground detection unit 420a includes a first conductive pattern 424a and openings 422a.

The first insulating layer 410 and the first conductive pattern 424a define the openings 422a. The openings 422a are formed to expose a portion of the substrate 101.

In some embodiments, the openings 422a may be formed to be separated in the first direction (the X direction of FIG. 2A). In some embodiments, distances by which the openings 422a are separated in the first direction are not constant.

In certain embodiments, an area of the openings 422a may be about 15% of that of the ground pad of the subject (not shown). In certain embodiments, a length of a side of each opening 422a may be about 40 to about 50 μm.

The first conductive pattern 424a is formed of doped polysilicon, a metal, a conductive metal nitride, a metal silicide, an alloy or a combination thereof.

The signal and power detection unit is not described in FIG. 4, but, as shown in FIG. 3, a structure of the signal and power detection unit (not shown) of the probe card inspection apparatus 400 may include conventional technologies. Thus, the descriptions will be omitted for convenience of explanation.

FIG. 5 is a plan view showing a part of a structure of a probe card inspection apparatus 500 according to another embodiment of the inventive concept. In FIG. 5, like reference numerals in the drawings denote like elements as shown in FIGS. 1A through 4, and thus their description will be omitted for convenience of explanation.

According to the above-described plan view, the probe card inspection apparatus 500 has a structure similar to that of the probe card inspection apparatus 100 of FIGS. 2B and 2C, and thus, in the present embodiment, their differences will be described with reference to the plan view corresponding to FIG. 2A.

Referring to FIG. 5, each of first detection units 520 includes a ground detection unit 520a which detects defects of a ground probe and a signal and power detection unit 520b which detects defects of a signal and power supply probe.

The ground detection unit 520a includes a first conductive pattern 524a which defines openings 522a, and the signal and power detection unit 520b includes a second conductive pattern which defines openings 522b.

The first and second conductive patterns 524a and 524b are formed of materials and through a manufacturing procedure that are similar to those of the first and second conductive patterns 124a and 124b.

The openings 522a may be formed in locations where ground pads of the subject (not shown) are disposed.

Each of the openings 522a may have a circular shape. For example, each of the openings 522a may be a circle of which a diameter along a first direction (an X direction of FIG. 5) and a diameter along a second direction (a Y direction of FIG. 5) are the same. In one embodiment, when the openings 522a are circles and appropriate locations of the probes are configured as a center of each circle, a distance between the first conductive pattern 524a and the right location of each probe is constant. Therefore, the location of each probe may be accurately detected. However, each opening 522a may be an oval of which the diameter along the first direction (the X direction of FIG. 5) is different from the diameter along the second direction (the Y direction of FIG. 5).

An area of each opening 522a may be smaller than that of the ground pad of the subject (not shown). For example, the area of each opening 522a may be about 15% of that of the ground pad of the subject (not shown). In certain embodiments, a diameter of each opening 522a may be about 40 to about 50 μm.

Each opening 522a may be formed in a location where a signal and power supply pad of the subject (not shown) is disposed.

In some embodiments, each opening 522a may be the circle of which the diameter along the first direction and the diameter along the second direction are the same. However, each opening 522a may also be an oval of which the diameter along the first direction (the X direction of FIG. 5) is different from the diameter along the second direction (the Y direction of FIG. 5).

Figure 6:
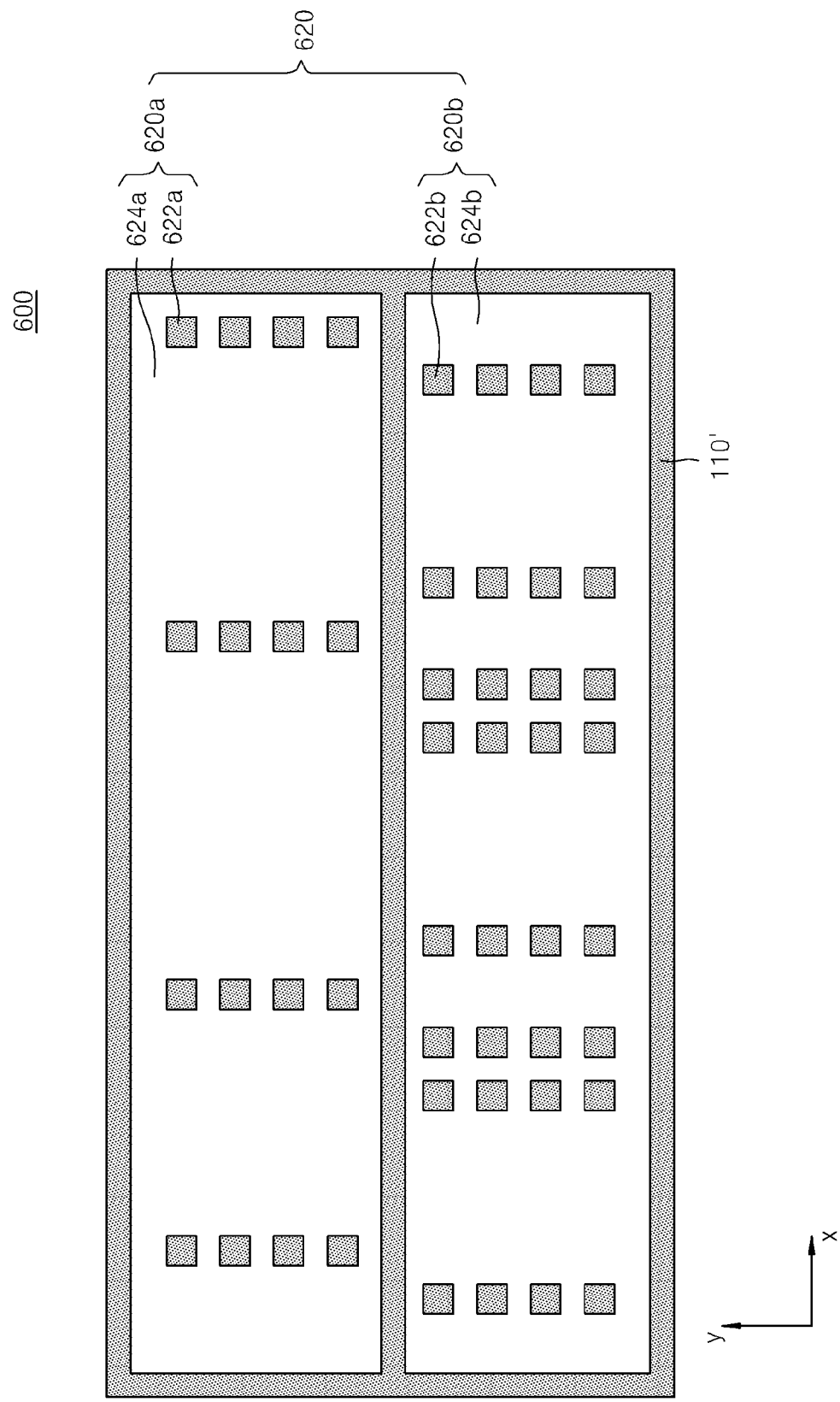
FIG. 6 is a plan view showing a part of a structure of a probe card inspection apparatus according to another embodiment of the inventive concept.

FIG. 6 is a plan view showing a part of a structure of a probe card inspection apparatus 600 according to another embodiment of the inventive concept. In FIG. 6, like reference numerals in the drawings denote like elements as shown in FIGS. 1A through 5, and thus their description will not be repeated for convenience of explanation.

According to the above-described plan view, the probe card inspection apparatus 600 has a structure similar to that of the probe card inspection apparatus 100 of FIGS. 2B and 2C, and thus, in the present embodiment, their differences will be described with reference to the plan view corresponding to FIG. 2A.

Referring to FIG. 6, each of first detection units 620 includes a ground detection unit 620a which detects defects of a ground probe, a signal and power detection unit 620b which detects defects of a signal and power supply probe, and an exposure portion 110' which exposes a portion of a first insulating layer (not shown).

The exposure portion 110' which exposes a portion of the first insulating layer 110 is formed to surround first and second conductive patterns 624a and 624b. For example, in one embodiment, the exposure portion 110' is formed to separate the first and second conductive patterns 624a and 624b from each other and to expose a portion of a top surface of the first insulating layer 110.

The ground detection unit 620a includes the first conductive pattern 624a which defines openings 622a and the second conductive pattern 624b which defines openings 622b.

The first conductive pattern 624a is separated from the second conductive pattern 624b, and thus a portion of the top surface of the first insulating layer 110 is exposed.

The first and second conductive patterns 624a and 624b may be formed of doped polysilicon, a metal, a conductive metal nitride, a conductive silicide, an alloy or a combination thereof, which are the same as in the first and second conductive patterns 124a and 124b.

In some embodiments, the first and second conductive patterns 624a and 624b may be formed of different materials. Alternatively, the first and second conductive patterns 624a and 624b may be formed of the same materials.

Figure 7A:
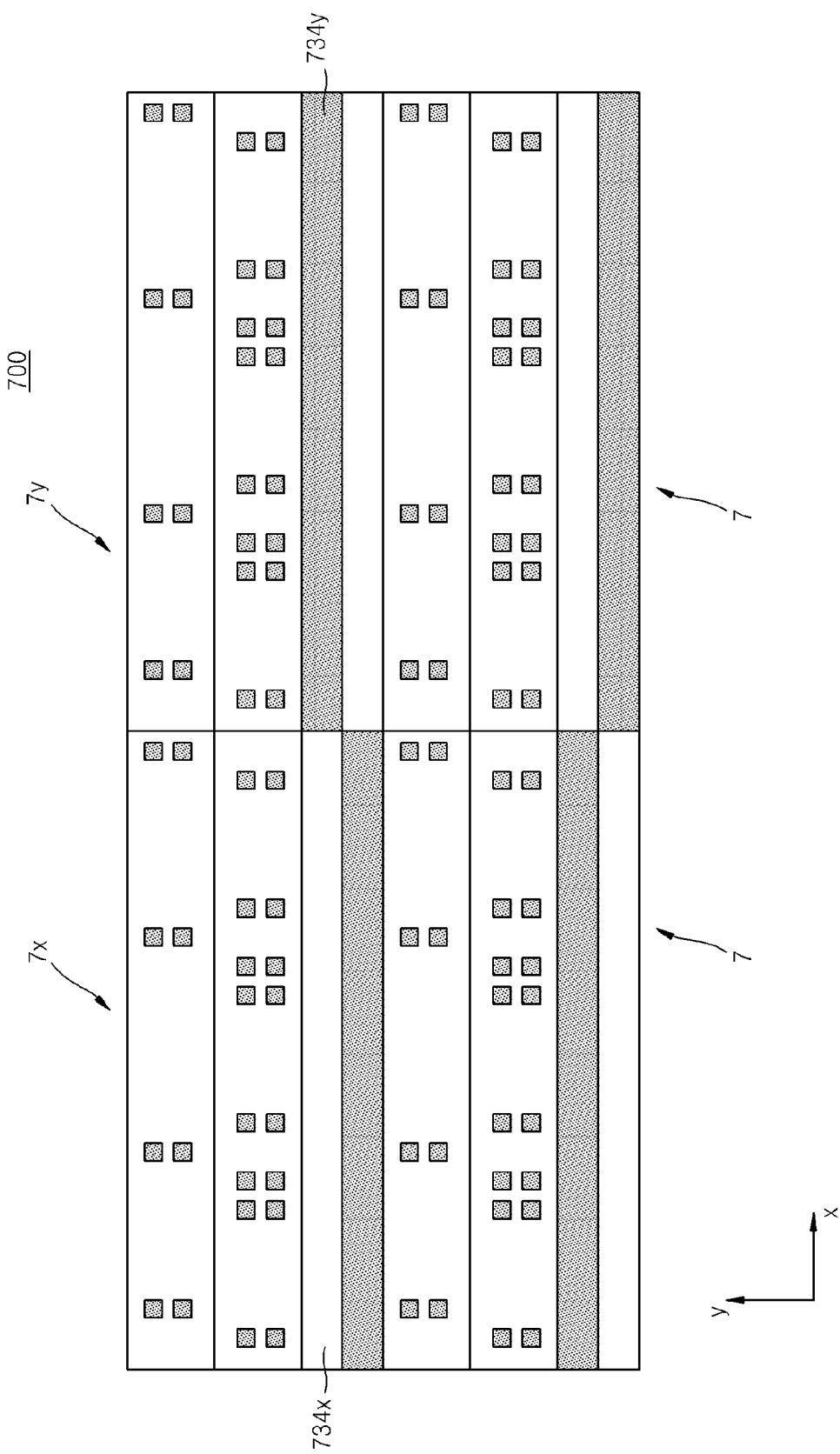
FIG. 7A is a plan view showing a part of a structure of a probe card inspection apparatus according to another embodiment of the inventive concept.
Figure 7B:
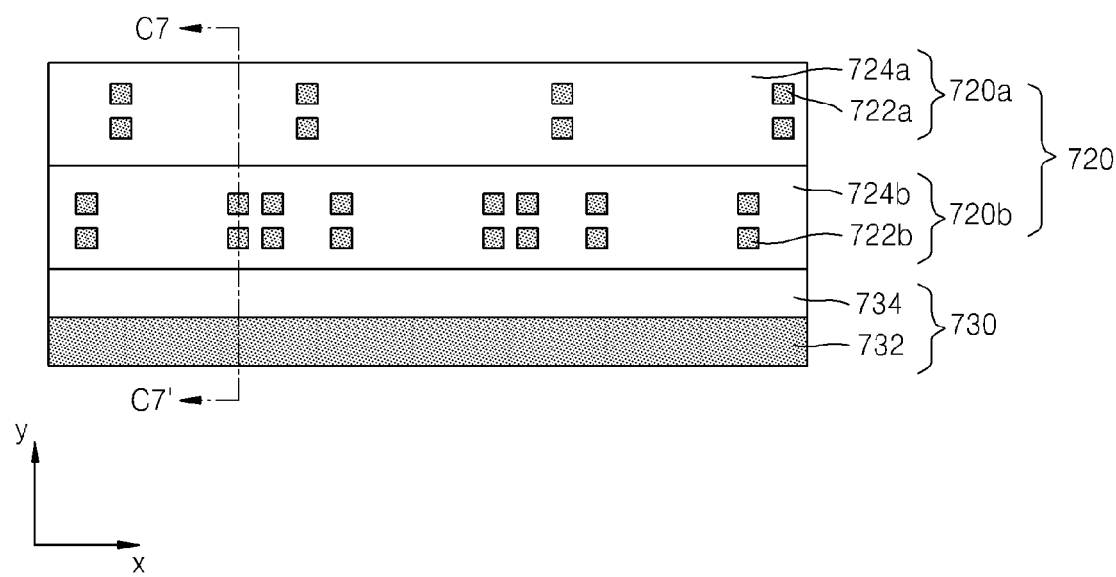
FIG. 7B is a plan view showing any one of detection units included in the probe card inspection apparatus of FIG. 7A, according to certain embodiments.
Figure 7C:
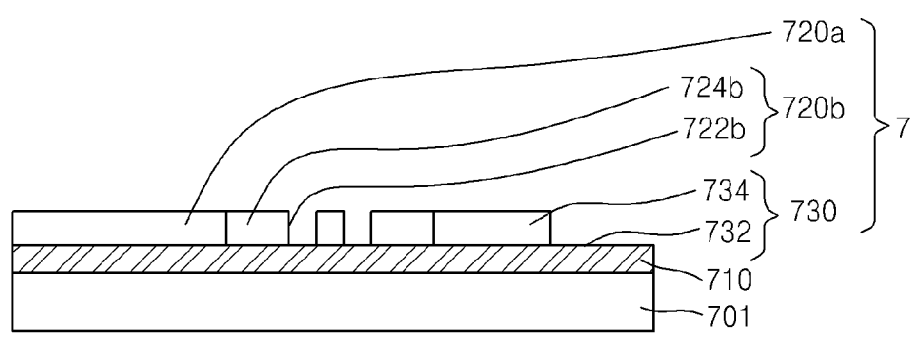
FIG. 7C is an exemplary cross-sectional view of FIG. 7B, taken along a line C7-C7' of FIG. 7B.

FIG. 7A is a plan view showing a part of a structure of a probe card inspection apparatus 700 according to another embodiment of the inventive concept, and FIG. 7B is a plan view showing any one of detection units 7 included in the probe card inspection apparatus 700 of FIG. 7A. FIG. 7C is a cross-sectional view of FIG. 7B, taken along a line C7-C7' of FIG. 7B. In FIGS. 7A through 7C, like reference numerals in the drawings denote like elements as shown in FIGS. 1A through 6, and thus their description will be omitted for convenience of explanation.

Referring to FIGS. 7A through 7C, the probe card inspection apparatus 700 includes a substrate 701, a first insulating layer 701 and the detection units 7.

In some embodiments, the substrate 701 may include, for example, crystalline Si, polycrystalline Si or amorphous Si. In other embodiments, the substrate 701 may include a semiconductor such as a Ge semiconductor, or a compound semiconductor such as an SiGe semiconductor, an SiC semiconductor, a GaAs semiconductor, an InAs semiconductor and an InP semiconductor.

The first insulating layer 710 may be formed, for example, of a silicon nitride, a silicon oxide or a combination thereof.

Each of the detection units 7 is formed on the first insulating layer 710 covering the substrate 701 and includes a first detection unit 720 which detects physical defects of a probe and a second detection unit 730 which detects electrical defects of a probe.

The first detection unit 720 includes a ground detection unit 720a which detects defects of a ground probe and a signal and power detection unit 720b which detects defects of a signal and power supply probe. The ground detection unit 720a includes a first conductive pattern 724a which defines openings 722a and the signal and power detection unit 720b includes a second conductive pattern 724b which defines openings 722b.

The second detection unit 730 includes a third conductive pattern 734 which defines an insulating part 732 which exposes a portion of the first insulating layer 710. The third conductive pattern 734 is formed to extend in a first direction (an X direction of FIG. 7B).

The first to third conductive patterns 724a, 724b and 734 may be formed of doped polysilicon, a metal, a conductive metal nitride, a conductive silicide, an alloy or a combination thereof, which are the same as in the first and second conductive patterns 120a and 120b. In some embodiments, the first to third conductive patterns 724a, 724b and 734 may be formed of different materials. Alternatively, the first to third conductive patterns 724a, 724b and 734 may be formed of the same materials.

The third conductive patterns 734x and 734y which are respectively formed on two detection units 7x and 7y, which are adjacent to each other, from among the detection units 7 may be alternately arranged.

Accordingly, as shown in FIGS. 1A through 1H, the third conductive pattern 734x contacts the probes of the first group 2100_1, and the third conductive pattern 734y contacts the probes of the second group 2100_2. Thus, even though the probes 2100 included in different groups are combined, defects of the interposer 2300 and those of the probes 2100 may be checked in each group, and also whether the grouping of the relays is normally performed may be checked.

In the present embodiment, the description of the second detection unit 730 is based on a case where the probes included in two different groups are combined. However, according to a structure of a probe card, the second detection unit 730 may be changed.

Figure 8:
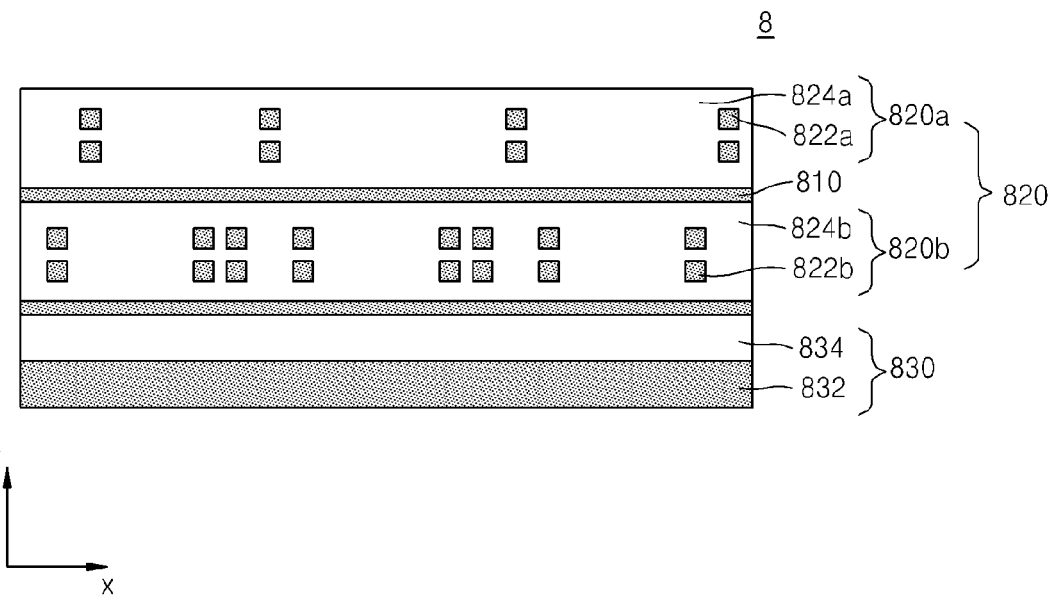
FIG. 8 is a plan view showing any one of detection units included in a probe card inspection apparatus according to another embodiment of the inventive concept.

FIG. 8 is a plan view showing any one of detection units 8 included in a probe card inspection apparatus according to another embodiment of the inventive concept. In FIG. 8, like reference numerals in the drawings denote like elements as shown in FIGS. 1A through 7C, and thus their description will not be repeated for convenience of explanation.

Referring to FIG. 8, each detection unit 8 includes a first detection unit 820 and a second detection unit 830. The first detection unit 820 includes a ground detection unit 820*a* and a signal and power detection unit 820*b*. The ground detection unit 820*a* includes a first conductive pattern 824*a* which defines openings 822*a* and a second conductive pattern 824*b* which defines openings 822*b*.

The second detection unit 830 includes a third conductive pattern 834 which defines an insulating part which exposes a portion of a first insulating layer 810. The third conductive pattern 834 is formed to extend in a first direction (an X direction of FIG. 8).

In some embodiments, the first detection unit 820 is separated from the second detection unit 830 in order to expose a portion of a top surface of the first insulating layer 810. The ground detection unit 820*a* may be separated from the signal and power detection unit 820*b* in order to expose a portion of the top surface of the first insulating layer 810.

The first through third conductive patterns 824*a*, 824*b* and 834 may be formed of doped polysilicon, a metal, a conductive metal nitride, a conductive silicide, an alloy or a combination thereof, which are the same as in the first and second conductive patterns 120*a* and 120*b*. In some embodiments, the first to third conductive patterns 824*a*, 824*b* and 834 may be formed of different materials. Alternatively, the first to third conductive patterns 824*a*, 824*b* and 834 may be formed of the same materials.

Figure 9:
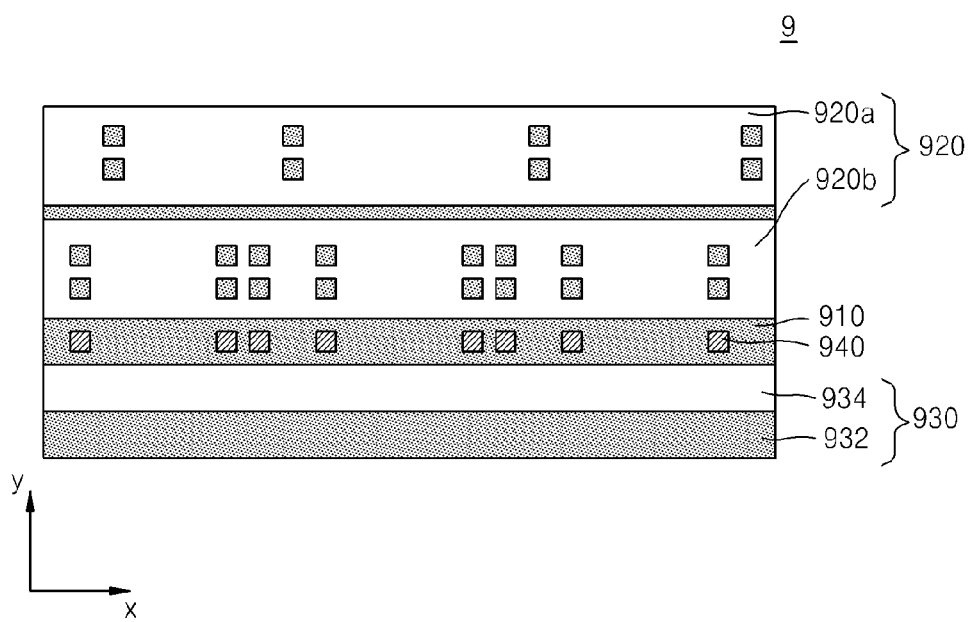
FIG. 9 is a plan view showing any one of detection units included in a probe card inspection apparatus according to another embodiment of the inventive concept.

FIG. 9 is a plan view showing any one of detection units 9 included in a probe card inspection apparatus according to another embodiment of the inventive concept. In FIG. 9, like reference numerals in the drawings denote like elements as shown in FIGS. 1A through 8, and thus their description will not be repeated for convenience of explanation.

Referring to FIG. 9, each detection unit 9 includes a first detection unit 920, a second detection unit 930 and arrangement pads 940.

In some embodiments, the first detection unit 920 is separated from the second detection unit 930 in order to expose a portion of a top surface of a first insulating layer 910, and the arrangement pads 940 are arranged on the exposed first insulating layer 910.

The arrangement pads 940 may function as pads for accurately adjusting locations of the detection units 9 that are selected according to necessity of a probe card (not shown).

Figure 10A:
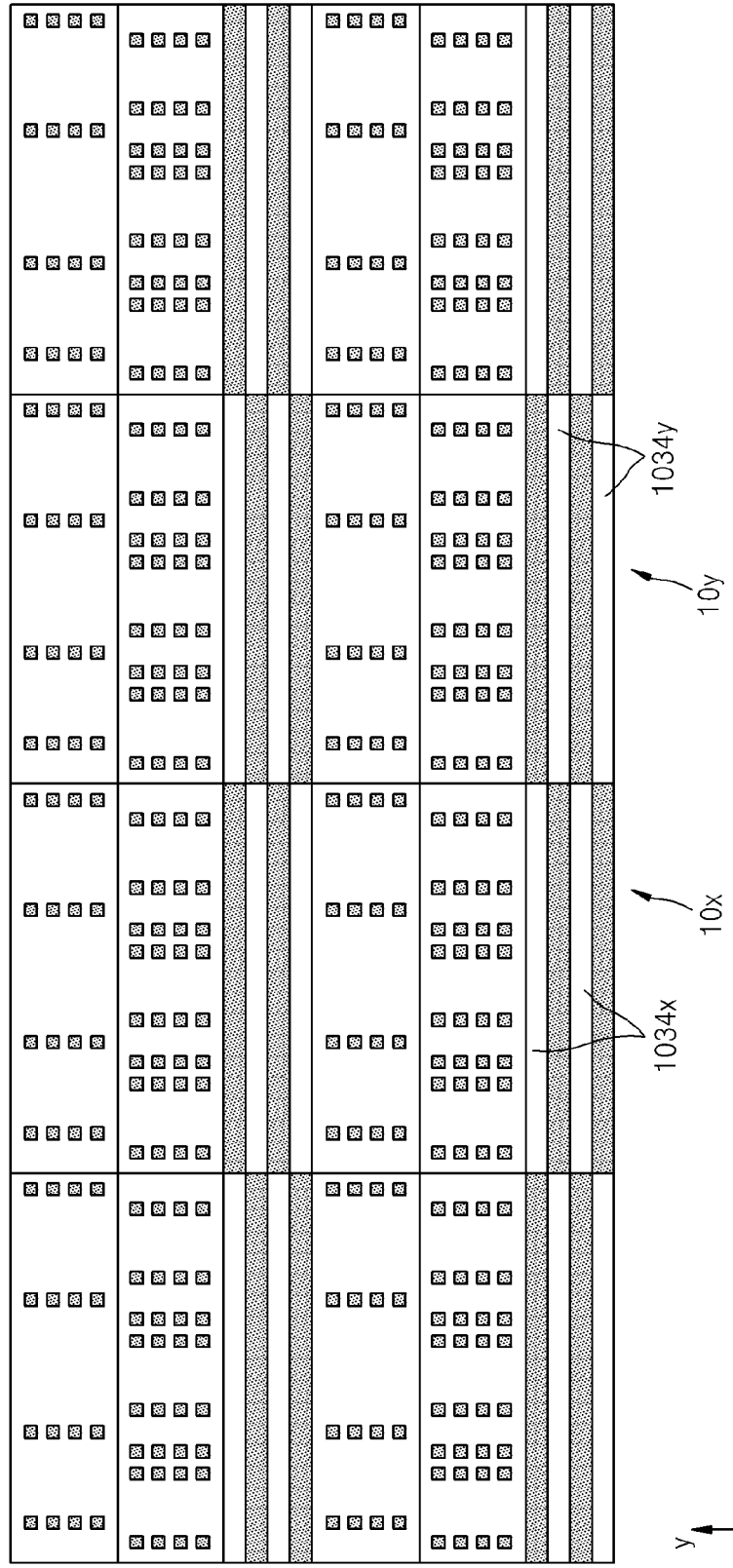
FIG. 10A is a plan view showing a part of a structure of a probe card inspection apparatus according to another embodiment of the inventive concept.

FIG. 10A is a plan view showing a part of a structure of a probe card inspection apparatus 1000 according to another embodiment of the inventive concept. FIG. 10B is a plan view showing any one of detection units 10 included in the probe card inspection apparatus 1000. In FIGS. 10A and 10B, like reference numerals in the drawings denote like elements as shown in FIGS. 1A through 9, and thus their description will not be repeated for convenience of explanation.

Referring to FIGS. 10A and 10B, the probe card inspection apparatus 1000 includes detection units 10.

Each detection unit 10 includes a first detection unit 1020 which detects physical defects of a probe and a second detection unit 1030 which detects electrical defects of a probe.

In some embodiments, the second detection unit 1030 may include one or more third conductive patterns 1034. For example, when four probe groups are combined to form two groups, the second detection unit 1030 may include two third conductive patterns 1034 as shown in the present embodiment.

The third conductive patterns 1034*x* and 1034*y* which are respectively formed on two detection units 10*x* and 10*y*, which are adjacent to each other, from among the detection units 10 may be alternately arranged.

Accordingly, as described with reference to FIGS. 1A through 1H, the third conductive pattern 1034*x* contacts the probes of the first group 2100_1, and the third conductive pattern 1034*y* contacts the probes of the second group 2100_2. Thus, even though the probes 2100 included in different groups are combined, defects of the interposer 2300 and those of the probes 2100 may be checked in each group, and also whether the grouping of the relays is normally performed may be checked.

In the present embodiment, the description of the second detection unit 1030 is based on a case where the probes 2100 included in four different groups are combined to form two multi junction groups. However, according to a structure of a probe card, the second detection unit 1030 may be changed.

The first detection unit 1020 includes a ground detection unit 1020*a* and a signal and power detection unit 1020*b*. The ground detection unit 1020 includes a first conductive pattern 1024*a*, and the signal and power detection unit 1020*b* includes a second conductive pattern 1024*b*.

The second detection unit 1030 includes a third conductive pattern 1034 which defines an insulating part 1032 exposing a portion of a first insulating layer 1010. The third conductive pattern 1034 is formed to extend in the first direction (the X direction of FIG. 7B).

The first through third conductive patterns 1024*a*, 1024*b* and 1034 may be formed of doped polysilicon, a metal, a conductive metal nitride, a conductive silicide, an alloy or a combination thereof, which are the same as in the first and second conductive patterns 120*a* and 120*b*. In some embodiments, the first to third conductive patterns 1024*a*, 1024*b* and 1034 may be formed of different materials. Alternatively, the first to third conductive patterns 1024*a*, 1024*b* and 1034 may be formed of the same materials.

Figure 11B:
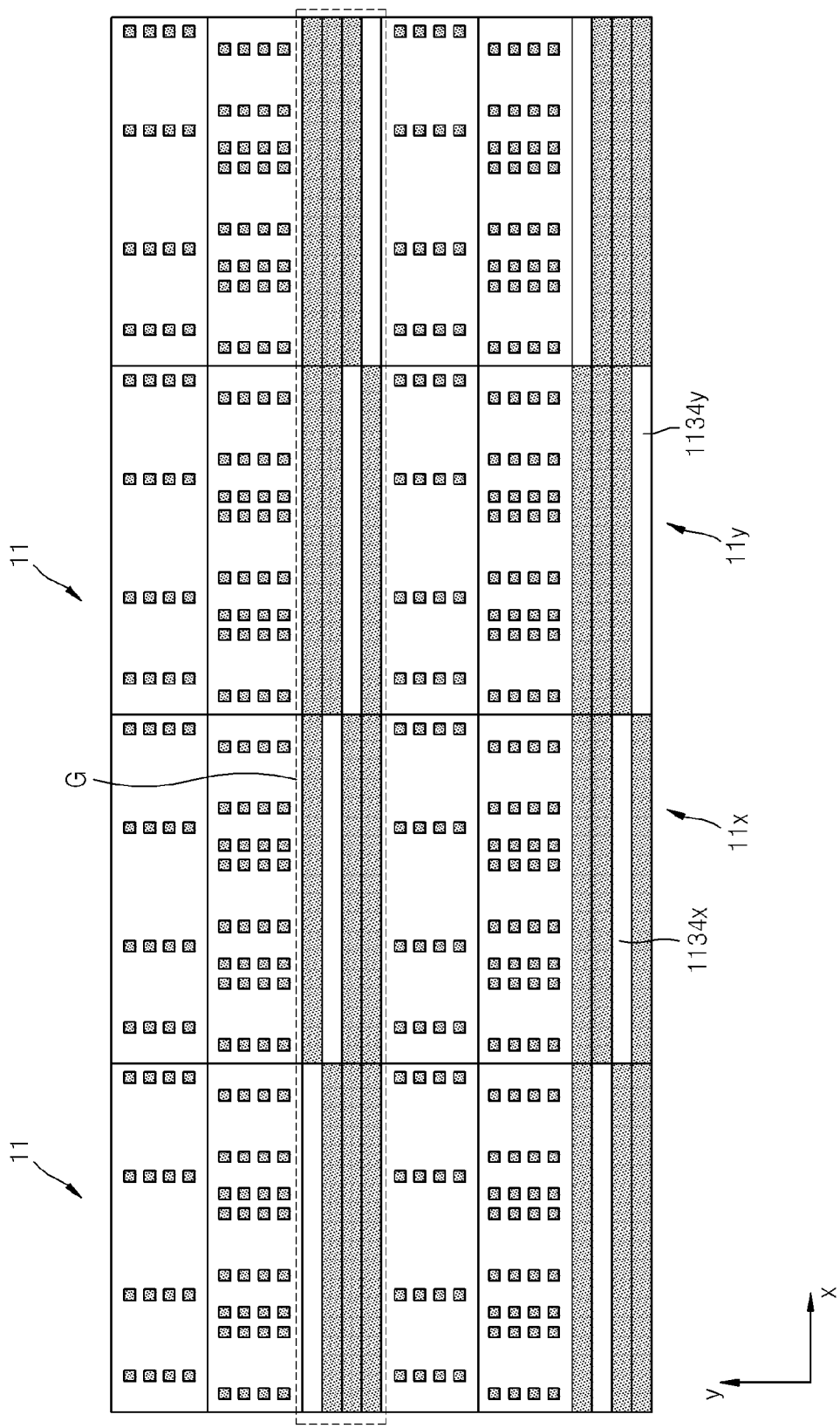
Figure 11D:
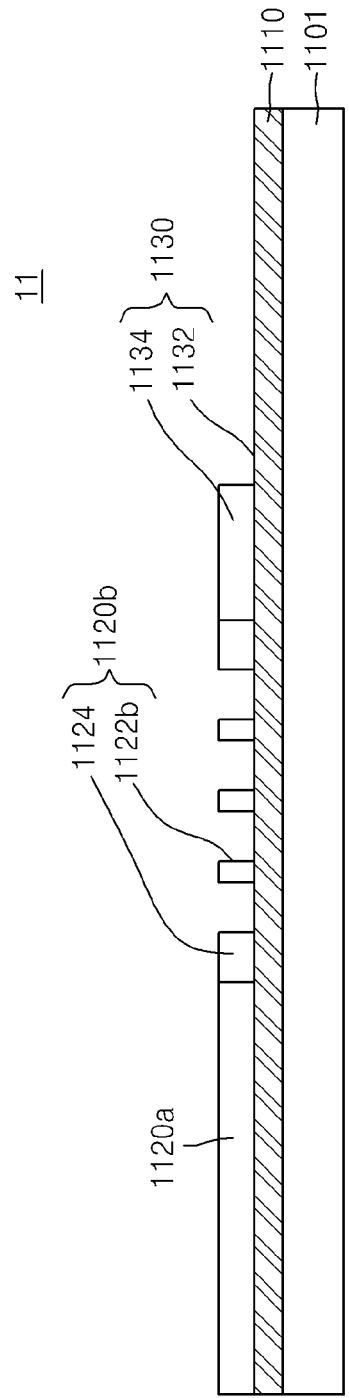
FIG. 11D is an exemplary linear cross-sectional view, taken along a line C11-C11' of FIG. 11C.

FIGS. 11A and 11B are plan views showing some parts of a structure of a probe card inspection apparatus 1100 according to another embodiment of the inventive concept. FIG. 11C is a plan view showing any one of detection units 11 included in the probe card inspection apparatus 1100 of FIG. 11A, and FIG. 11D is a linear cross-sectional view, taken along a line C11-C11' of FIG. 11C. In FIGS. 11A through 11D, like reference numerals in the drawings denote like elements as shown in FIGS. 1A through 10, and thus their description will not be repeated for convenience of explanation.

Referring to FIGS. 11A through 11D, the probe card inspection apparatus 1100 includes a substrate 1101, a first insulating layer 1110 and the detection units 11.

In some embodiments, the substrate 1101 may have the same form as a semiconductor wafer. The substrate 1101 may include a Si semiconductor or a compound semiconductor. However, the substrate 1101 does not actually use the semiconductor wafer, and may be manufactured as the semiconductor wafer formed of hard materials, for example, metal materials such as stainless steel.

In some embodiments, the first insulating layer 1110 may be formed of a silicon nitride, a silicon oxide or a combination thereof.

Each detection unit 11 is formed on the first insulating layer 1110 covering the substrate 1101, and includes a first detection unit 1120 which detects physical defects of a probe and a second detection unit 1130 which detects electrical defects of a probe.

The first detection unit 1120 includes a ground detection unit 1120a which detects defects of a ground probe and a signal and power detection unit 1120b which detects defects of a signal and power supply probe. The ground detection unit 1120a includes a first conductive pattern 1124a which defines openings 1122a and a second conductive pattern 1124b which defines openings 1122b.

The second detection unit 1130 includes a third conductive pattern 1134 which defines an insulating part 1132 exposing a portion of the first insulating layer 1110. The third conductive pattern 1134 is formed to extend in the first direction (the X direction of FIG. 7B).

The first through third conductive patterns 1124a, 1124b and 1134 may be formed of doped polysilicon, a metal, a conductive metal nitride, a conductive silicide, an alloy or a combination thereof, which are the same as in the first and second conductive patterns 120a and 120b. In some embodiments, the first to third conductive patterns 1124a, 1124b and 1134 may be formed of different materials. Alternatively, the first to third conductive patterns 1124a, 1124b and 1134 may be formed of the same materials.

The third conductive patterns 1134x and 1134y which are respectively formed on two detection units 11x and 11y, which are adjacent to each other, from among the detection units 10 may be alternately arranged.

In the present embodiment, the description of the second detection unit 1130 is based on a case where the probes 2100 included in four different groups are combined into four multi junction groups. However, according to a structure of a probe card, the second detection unit 1130 may be changed.

Manufacture of the probe card inspection apparatus 1100 may be performed by a manufacturing procedure similar to that of the probe card inspection apparatus 100.

FIGS. 12A to 12F are cross-sectional views for explaining a method of manufacturing a probe card inspection apparatus according to an embodiment of the inventive concept, which is illustrated according to a manufacturing procedure.

Figure 12A:
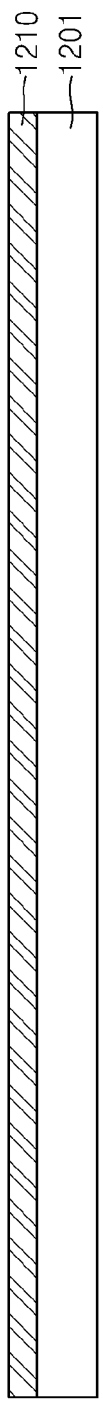

Referring to FIG. 12A, a first insulating layer 1210 is formed on a top surface of a substrate 1201. The first insulating layer 1210 may be formed by a deposition process.

Figure 12B:
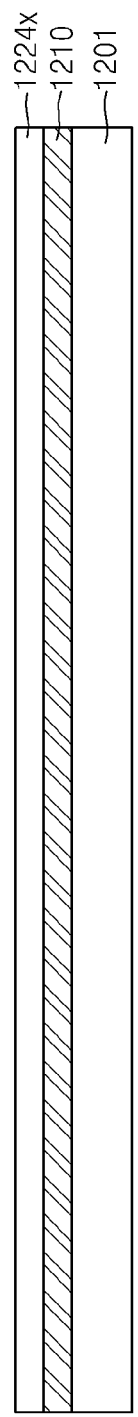

Referring to FIG. 12B, a conductive film 1224x is formed on the first insulating layer 1210. In some embodiments, the conductive film 1224x may be formed by a compression or cladding process. In other embodiments, the conductive film 1224x may be formed by CVD, MOCVD, ALD or MOALD, but a formation of the conductive film 1224x is not limited thereto.

Figure 12C:
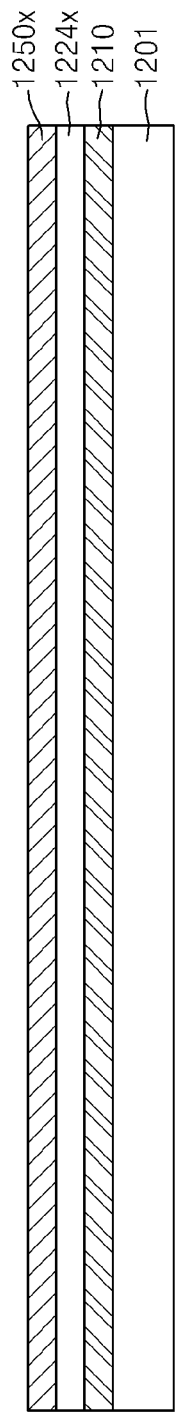
Figure 12D:
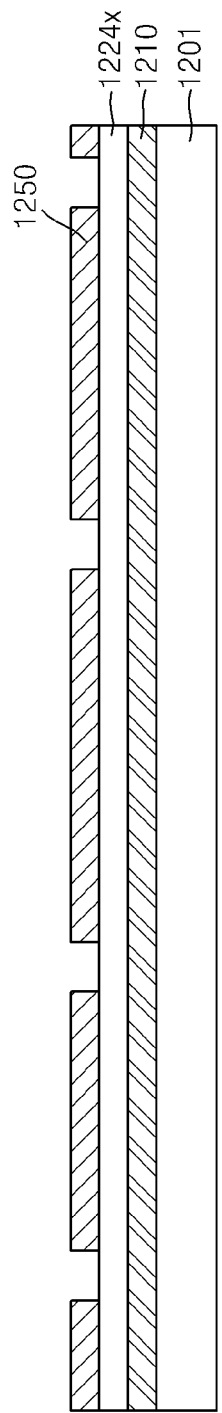

Referring to FIGS. 12C and 12D, a photoresist layer 1250x is formed on the conductive film 1224x. Then, locations where openings 1222a are formed in some portions of the photoresist layer 1250x through a post process are exposed to light by using a photomask. The portions of the photoresist layer 1250x, which are exposed to the light, are removed using a developer, and then photoresist patterns 1250 are formed. In the present embodiment, the photoresist layer 1225x is a positive resist from which the exposed portions are removed, but may be a negative resist from which unexposed portions are removed.

Referring to FIG. 12E, exposed portions of the conductive film 1224x are removed by an etching process, and thus first conductive patterns 1224a are formed. Although not illustrated, second and third patterns may be formed by the same process.

Referring to FIG. 12F, the photoresist patterns 1250 are removed from the first conductive patterns 1224a, and then a completed probe card inspection apparatus is washed.

While the disclosure has been particularly shown and described with reference to exemplary embodiments thereof, it will be understood that various changes in form and details may be made therein without departing from the spirit and scope of the following claims.

What is claimed is:

1. A probe card inspection apparatus comprising:
   a substrate;
   a first insulating layer that covers the substrate; and
   a first detection unit that is formed on the first insulating layer and detects physical defects of a probe of a probe card,
   wherein the first detection unit comprises:
   a ground detection unit comprising a first conductive pattern that defines a plurality of openings that expose a portion of the first insulating layer and detect defects of a ground probe of the probe card and; and
   a signal and power detection unit comprising a second conductive pattern that defines a plurality of openings that expose another portion of the first insulating layer and detect defects of a signal and power supply probe of the probe card.

2. The probe card inspection apparatus of claim 1, wherein each of the plurality of openings defined by the first conductive pattern is formed at a location corresponding to a location where the ground probe of the probe card is disposed, and
   wherein each of the plurality of openings defined by the second conductive pattern is formed at a location corresponding to a location where the signal and power supply probe of the probe card is disposed.

3. The probe card inspection apparatus of claim 1, wherein the plurality of openings defined by the first conductive pattern and the plurality of openings defined by the second conductive pattern are formed to expose a top surface of the substrate.

4. The probe card inspection apparatus of claim 1, wherein the first conductive pattern and the second conductive pattern are separated to expose a portion of a top surface of the first insulating layer.

5. The probe card inspection apparatus of claim 1, wherein each of the plurality of openings defined by the first conductive pattern is formed to be separated in a first direction, and
   wherein each of the plurality of openings defined by the second conductive pattern is formed to be separated in the first direction.

6. The probe card inspection apparatus of claim 5, wherein each of the plurality of openings defined by the first conductive pattern and each of the plurality of openings defined by the second conductive pattern have a rectangular shape of which a length of a side along the first direction is different from a length of a side along a second direction perpendicular to the first direction.

7. The probe card inspection apparatus of claim 5, wherein distances by which each of the plurality of openings defined by the first conductive pattern, and by which each of the plurality of openings defined by the second conductive pattern are separated in the first direction are not constant.

8. The probe card inspection apparatus of claim 1, further comprising a second insulating layer formed on the plurality of openings defined by the first conductive pattern and the plurality of openings defined by the second conductive pattern.

9. The probe card inspection apparatus of claim 8, wherein a top surface of the second insulating layer is disposed on the same level as a top surface of the first conductive pattern and a top surface of the second conductive pattern.

10. A probe card inspection apparatus comprising:
a substrate;
a first insulating layer which covers the substrate; and
a plurality of detection units which are formed on the first insulating layer,
wherein each of the plurality of detection units comprises a first detection unit which detects physical defects of a probe and a second detection unit which detects electrical defects of the probe,
wherein the first detection unit comprises:
a ground detection unit which detects defects of a ground probe and comprises a first conductive pattern which defines a plurality of openings exposing a portion of the first insulating layer; and
a signal and power detection unit which detects defects of a signal and power supply probe and comprises a second conductive pattern which defines a plurality of openings exposing another portion of the first insulating layer, and
wherein the second detection unit comprises a third conductive pattern that is formed to extend in a first direction.

11. The probe card inspection apparatus of claim 10, wherein the third conductive patterns that are formed on two detection units, which are adjacent to each other in the first direction, from among the plurality of detection units are alternately arranged.

12. The probe card inspection apparatus of claim 10, wherein the first detection unit and the second detection unit are separated to expose a portion of a top surface of the first insulating layer.

13. The probe card inspection apparatus of claim 10, wherein each of the detection units is separated from each other in order to expose a portion of a top surface of the first insulating layer.

14. The probe card inspection apparatus of claim 10, further comprising arrangement pads arranged between the first detection unit and the second detection unit.

15. The probe card inspection apparatus of claim 10, wherein the second detection unit comprises one or more third conductive patterns.

16. A probe card inspection apparatus comprising: an insulating layer;
a first conductive pattern which is formed on the insulating layer;
a second conductive pattern which is formed on the insulating layer,
wherein the first conductive pattern comprises a plurality of first openings which are formed on a location corresponding to a location where a ground probe of a probe card is disposed, and
wherein the second conductive pattern comprises a plurality of second openings which are formed on a location corresponding to a location where a signal and power supply probe of the probe card is disposed;
a third conductive pattern which is formed on the insulating layer; and
an insulating part which is defined by the third conductive pattern,
wherein the third conductive pattern detects electrical defects of the ground probe and the signal and power supply probe.

17. The probe card inspection apparatus of claim 16, wherein the plurality of first openings and the plurality of second openings are formed to expose a top surface of the insulating layer.

18. The probe card inspection apparatus of claim 16, wherein an area of each of the plurality of first openings is smaller than an area of a ground pad of a subject.

19. The probe card inspection apparatus of claim 16, wherein an area of each of the plurality of second openings is smaller than an area of a signal and power supply pad of a subject.

* * * * *